(12) United States Patent
Hsieh et al.

(10) Patent No.: US 12,261,133 B2
(45) Date of Patent: Mar. 25, 2025

(54) INTERPOSER WITH WARPAGE-RELIEF TRENCHES

(71) Applicant: Taiwan Semiconductor Manufacturing Company, Ltd., Hsinchu (TW)

(72) Inventors: Tsung-Yang Hsieh, Taipei (TW); Chien-Chang Lee, Miaoli County (TW); Chia-Ping Lai, Hsinchu (TW); Wen-Chung Lu, Hsinchu (TW); Cheng-Kang Huang, Hsinchu (TW); Mei-Shih Kuo, Hsinchu (TW); Chih-Ai Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/628,804

(22) Filed: Apr. 8, 2024

(65) Prior Publication Data
US 2024/0282718 A1  Aug. 22, 2024

Related U.S. Application Data

(63) Continuation of application No. 17/547,218, filed on Dec. 9, 2021, now Pat. No. 11,973,040.

(60) Provisional application No. 63/179,154, filed on Apr. 23, 2021.

(51) Int. Cl.
| *H01L 23/00* | (2006.01) |
| *H01L 21/48* | (2006.01) |
| *H01L 25/00* | (2006.01) |
| *H01L 25/065* | (2023.01) |

(52) U.S. Cl.
CPC ........ *H01L 23/562* (2013.01); *H01L 21/4846* (2013.01); *H01L 25/0652* (2013.01); *H01L 25/50* (2013.01)

(58) Field of Classification Search
CPC .............. H01L 23/562; H01L 21/4846; H01L 25/0652
See application file for complete search history.

(56) References Cited

U.S. PATENT DOCUMENTS

2013/0049216 A1  2/2013 Lin
2021/0074682 A1  3/2021 Chen

*Primary Examiner* — Errol V Fernandes
(74) *Attorney, Agent, or Firm* — Kilpatrick Townsend & Stockton LLP

(57) ABSTRACT

A method is provided for forming an integrated circuit (IC) chip package structure. The method includes: providing an interposer having a front surface and a back surface, the interposer comprising a substrate, at least one routing region, and at least one non-routing region; forming at least one warpage-reducing trench in the at least one non-routing region, wherein the at least one warpage-reducing trench extends from the front surface of the interposer to a first depth, the first depth smaller than a thickness between the front surface and the back surface of the interposer; depositing a warpage-relief material in the at least one warpage-reducing trench; and bonding the group of IC dies to the front surface of the interposer.

20 Claims, 15 Drawing Sheets

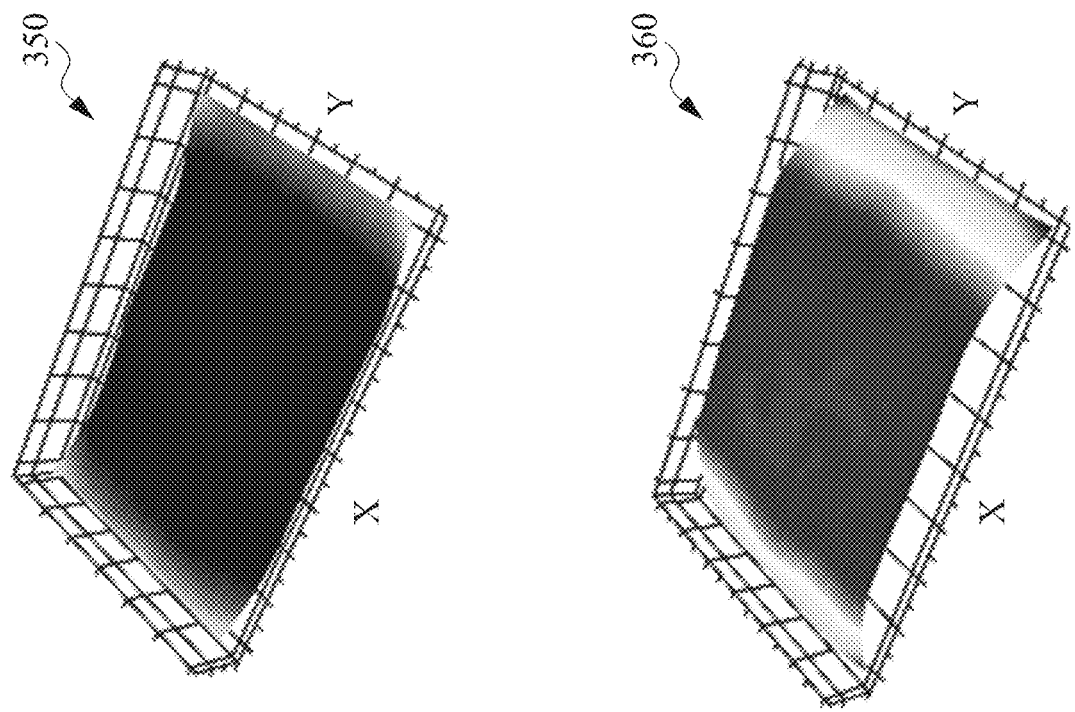
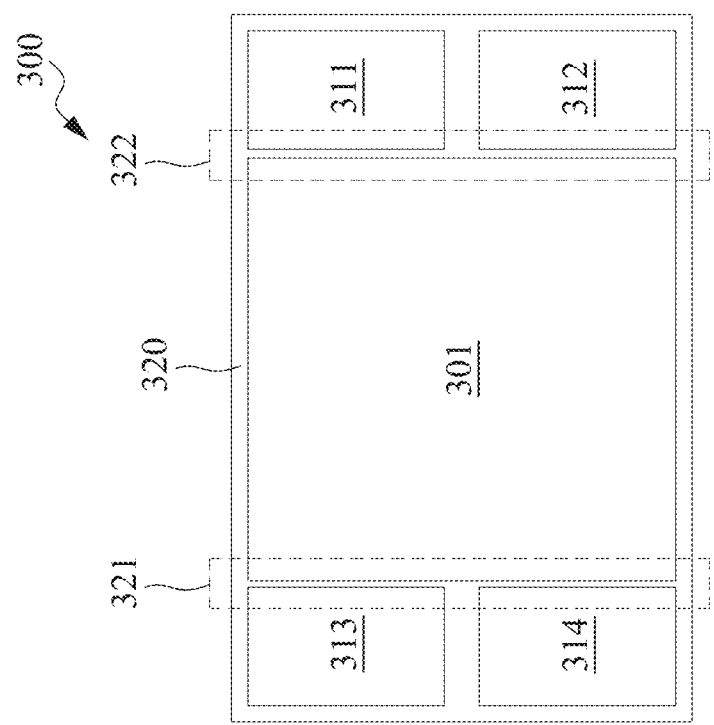
FIG. 3

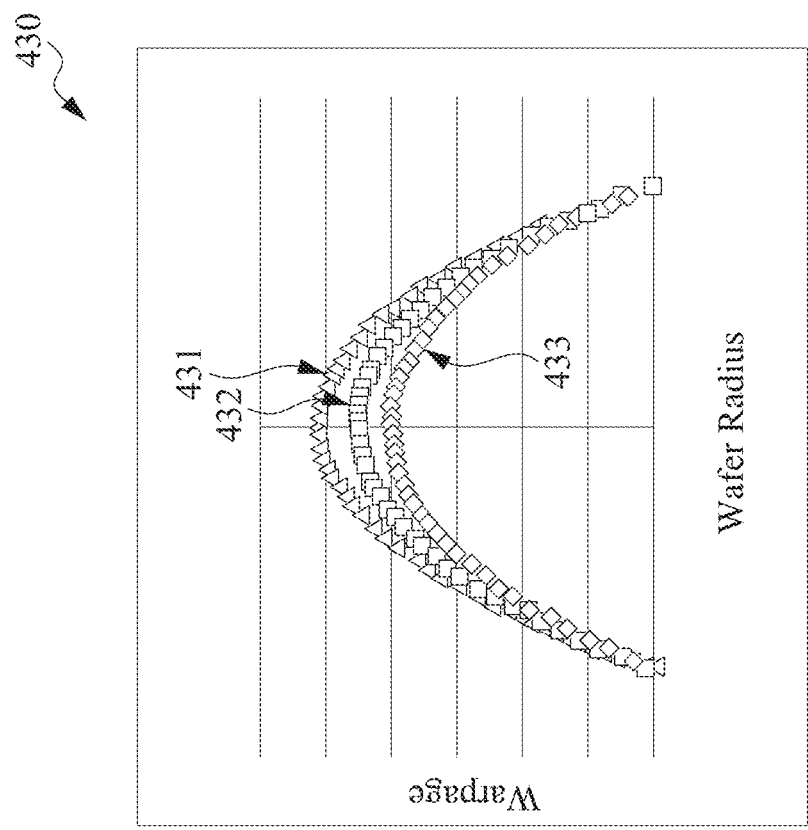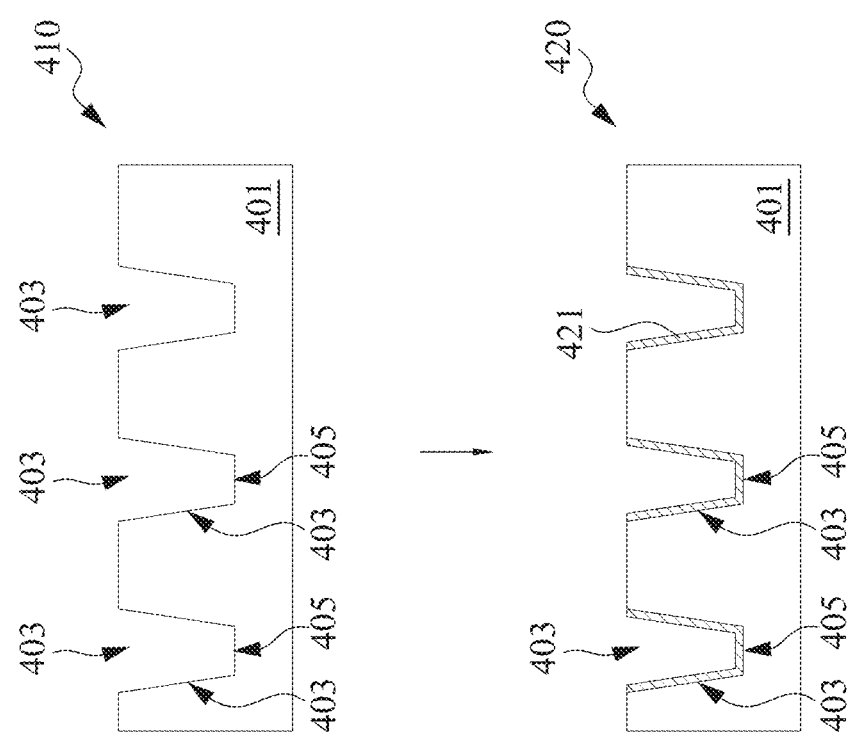
FIG. 4

INTERPOSER WITH WARPAGE-RELIEF TRENCHES

PRIORITY CLAIM AND CROSS-REFERENCE

This application is a continuation of U.S. application Ser. No. 17/547,218, filed Dec. 9, 2021, which claims the benefit of U.S. Provisional Patent Application No. 63/179,154, filed Apr. 23, 2021. The disclosure of the above application is incorporated by reference herein in its entirety.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

With advances in semiconductor technology, various integration and packaging technologies have been developed to stack and package multiple integrated circuit (IC) dies or packages into a single package. In some cases, an interposer is used to provide electrical interface routing between chips or packages.

Even though widely used, current packaging techniques suffer many limitations and drawbacks. Therefore, improved semiconductor packaging technology is highly desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 shows a top view of an exemplary IC chip package structure and images of measured warpages, in accordance with some embodiments.

FIG. 4 is a cross-sectional view of a portion of an interposer with trenches and a graph of interposer wafer warpage versus thickness of filling material, in accordance with some embodiments.

DETAILED DESCRIPTION

Figure 1A:
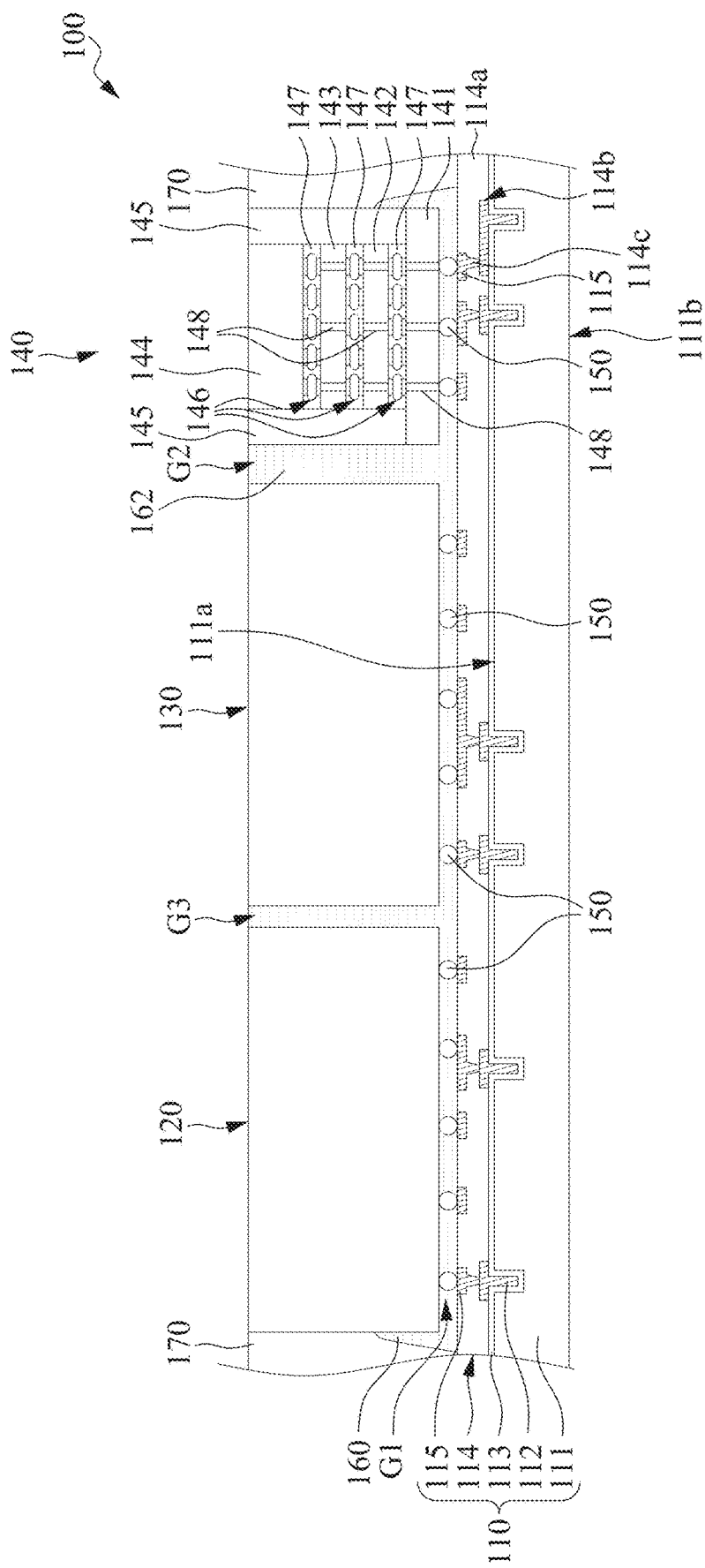
FIGS. 1A and 1B are cross-sectional views of various stages of a process for forming a chip package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to an interposer that can be disposed on top of a substrate to provide electrical connection between the substrate and chip structures disposed on the interposer. Materials expand or contract depending on their thermal expansion coefficients. As will be described, an insight provided by the present disclosure is that undesired warpage on the interposer can be caused during manufacturing of the chip structures. For example, in a semiconductor device, layers of different materials are in close contact, and mismatch in thermal expansion coefficients can cause thermal stresses in adjacent materials. For example, during a thermal process, the interposer can be caused to bend undesirably by the chip structures. For addressing this, various embodiments provide techniques to deposit different materials in the interposer in a controlled manner. These materials are selected for their characteristics of thermal expansion. In various embodiments, warpage characteristics in the interposer is identified, and trenches are formed in the interposer based on the identified warpage characteristic, and one or more materials are selected to be deposited in the interposer in the trenches to reduce the warpage.

Figure 1B:
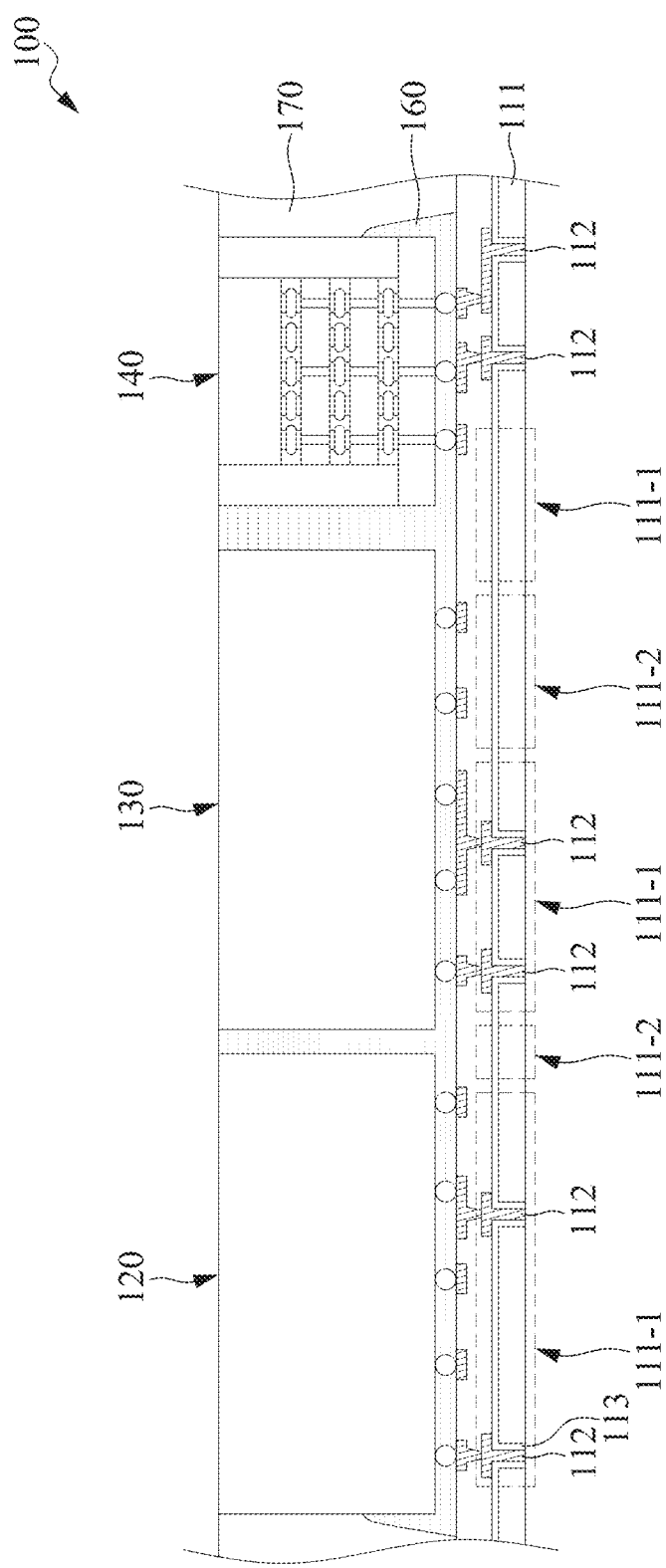

FIGS. 1A and 1B are cross-sectional views of various stages of a process for forming a chip package structure, in accordance with some embodiments. As shown in FIG. 1A, a substrate 110 is provided, in accordance with some embodiments. In some embodiments, the substrate 110 is a wafer. The substrate 110 includes a semiconductor structure 111, conductive vias 112, an insulating layer 113, a redistribution structure 114, and conductive pads 115, in accordance with some embodiments.

The semiconductor structure 111 has surfaces 111 a and 111 b, in accordance with some embodiments. In some embodiments, the semiconductor structure 111 is made of an elementary semiconductor material including silicon or germanium in a single crystal, poly crystal, or amorphous structure. In some other embodiments, the semiconductor structure 111 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor structure 111 may also include multi-layer semiconductors, semiconductor on insulator (SOI) (such as silicon on insulator or germanium on insulator), or a combination thereof.

In some embodiments, the substrate 110 is an interposer wafer. The conductive vias 112 are formed in the semiconductor structure 111, in accordance with some embodiments. The conductive vias 112 may be formed to extend from the surface 111a into the semiconductor structure 111.

The insulating layer 113 is formed over the semiconductor structure 111, in accordance with some embodiments. The insulating layer 113 is between the conductive vias 112 and the semiconductor structure 111, in accordance with some embodiments. The insulating layer 113 is configured to electrically insulate the conductive vias 112 from the semiconductor structure 111, in accordance with some embodiments. The insulating layer 113 is made of an oxide-containing material such as silicon oxide, in accordance with some embodiments. The insulating layer 113 is formed using an oxidation process, a deposition process, or another suitable process.

In some other embodiments, the substrate 110 is a device wafer that includes active devices or circuits. The active devices may include transistors (not shown) formed at the surface 111 a. The substrate 110 may also include passive devices (not shown) formed in or over the semiconductor structure 111, in accordance with some embodiments. The passive devices include resistors, capacitors, or other suitable passive devices.

The redistribution structure 114 is formed over the semiconductor structure 111, in accordance with some embodiments. The conductive pads 115 are formed over the redistribution structure 114, in accordance with some embodiments. The redistribution structure 114 includes a dielectric layer 114 a, wiring layers 114 b, and conductive vias 114 c, in accordance with some embodiments. The dielectric layer 114 a is formed over the surface 111 a, in accordance with some embodiments. The wiring layers 114 b are formed in the dielectric layer 114 a, in accordance with some embodiments. In some embodiments, the redistribution structure 114 provides interconnections between chip structures 120, 130, and 140, and to the semiconductor structure 111.

As shown in FIG. 1A, the conductive vias 114 c are electrically connected between different wiring layers 114 b and between the wiring layer 114 b and the conductive pads 115, in accordance with some embodiments. For the sake of simplicity, FIG. 1A only shows one of the wiring layers 114 b, in accordance with some embodiments. The conductive vias 112 are electrically connected to the conductive pads 115 through the wiring layers 114 b and the conductive vias 114 c, in accordance with some embodiments.

As shown in FIG. 1A, the chip structures 120, 130, and 140 are bonded to the substrate 110 through the conductive bumps 150 between the chip structures 120, 130 and 140 and the substrate 110, in accordance with some embodiments. The chip structure 120 or 130 includes a chip, such as a system on chip (SoC), in accordance with some embodiments. In some other embodiments, the chip structure 120 or 130 includes a chip package structure.

In some embodiments, the chip structure 140 includes multiple semiconductor dies. As shown in FIG. 1A, the chip structure 140 includes semiconductor dies 141, 142, 143, and 144, in accordance with some embodiments. In some embodiments, the chip structure 140 includes a molding layer 145 that encapsulates and protects the semiconductor dies 142, 143 and 144. The molding layer 145 may include an epoxy-based resin with fillers dispersed therein. The fillers may include insulating fibers, insulating particles, other suitable elements, or a combination thereof.

In some embodiments, the semiconductor dies 142, 143 and 144 are memory dies. The memory dies may include memory devices such as static random access memory (SRAM) devices, dynamic random access memory (DRAM) devices, other suitable devices, or a combination thereof. In some embodiments, the semiconductor die 141 is a control die that is electrically connected to the memory dies (e.g., the semiconductor dies 142, 143 and 144) stacked thereon. The chip structure 140 may function as a high bandwidth memory (HBM).

Many variations and/or modifications can be made to embodiments of the disclosure. In some embodiments, the chip structure 140 includes a single semiconductor chip. The semiconductor chip may be a system on chip.

In some embodiments, conductive bonding structures 146 are formed between the semiconductor dies 141, 142, 143 and 144 to bond them together, as shown in FIG. 1A. In some embodiments, each of the conductive bonding structures 146 includes metal pillars and/or solder bumps.

In some embodiments, underfill layers 147 are formed between the semiconductor dies 141, 142, 143 and 144 to surround and protect the conductive bonding structures 146. In some embodiments, the underfill layer 147 includes an epoxy-based resin with fillers dispersed therein. The fillers may include insulating fibers, insulating particles, other suitable elements, or a combination thereof.

In some embodiments, multiple conductive vias 148 are formed in the semiconductor dies 141, 142, and 143, as shown in FIG. 1A. Each conductive via 148 penetrates through one of the semiconductor dies 141, 142, and 143 and is electrically connected to the conductive bonding structures 146 thereunder and/or thereover. Electrical signals can be transmitted between these vertically stacked semiconductor dies 141, 142, 143 and 144 through the conductive vias 148.

As shown in FIG. 1A, an underfill layer 160 is formed into a gap G1 between the substrate 110 and each of the chip structures 120, 130, and 140, in accordance with some embodiments. As shown in FIG. 1A, a gap G2 between the chip structures 130 and 140 is filled with a portion 162 of the underfill layer 160, in accordance with some embodiments.

As shown in FIG. 1A, a gap G3 between the chip structures 120 and 130 is filled with the underfill layer 160, in accordance with some embodiments. The underfill layer 160 surrounds the chip structures 120, 130, and 140, in accordance with some embodiments. The underfill layer 160 is referred to as a protective layer, in accordance with some embodiments. The underfill layer 160 includes a polymer material, in accordance with some embodiments As shown in FIG. 1A, a molding layer 170 is formed over the substrate 110 to surround the chip structures 120, 130 and 140 and the conductive bumps 150, in accordance with some embodiments. The molding layer 170 includes a polymer material, in accordance with some embodiments.

As shown in FIG. 1B, a lower portion of the semiconductor structure 111 is removed, in accordance with some embodiments. The removal process includes a chemical mechanical polishing process, in accordance with some embodiments. After the removal process, the conductive vias 112 and the insulating layer 113 are exposed, in accordance with some embodiments.

The conductive vias 112 and the insulating layer 113 pass through the semiconductor structure 111, in accordance with some embodiments. The conductive vias 112 are also referred to as through-substrate vias (TSVs) or through-silicon vias when the semiconductor structure 111 is a silicon substrate, in accordance with some embodiments.

In accordance with some embodiments, the semiconductor structure 111 includes additional interconnect structures, besides the TSVs shown in FIG. 1B. For example, the additional interconnect structures can include metal interconnect lines formed in dielectric layers. In some embodiments, the semiconductor structure 111 is divided into routing regions 111-1 and non-routing regions 111-2. The interconnect structures are disposed in the routing regions 111-1, and no interconnect structures are disposed in the non-routing regions 111-2. In accordance with some embodiments, the non-routing regions 111-2 are available for modification without affecting the bonding and interconnection of the chip package. For example, the non-routing regions 111-2 can be used for forming stress and warpage relief structures, as described below.

Figure 2:
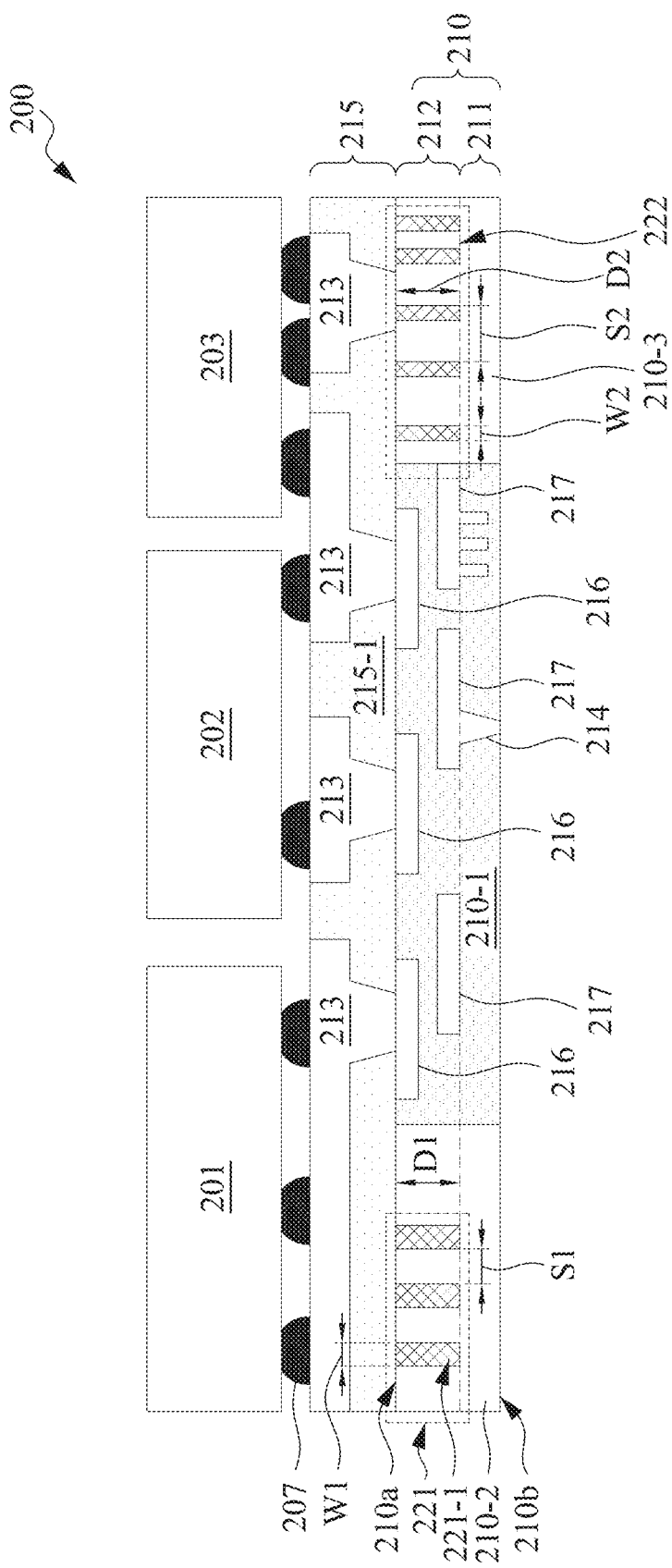
FIG. 2 is a cross-sectional view of an exemplary integrated circuit (IC) chip package structure having an interposer with warpage-reducing trenches, in accordance with some embodiments.

FIG. 2 is a cross-sectional view of an exemplary IC chip package structure having an interposer with warpage-reducing trenches, in accordance with some embodiments. As shown in FIG. 2, an integrated circuit (IC) chip package structure 200 includes an interposer 210 having a substrate 211 and an insulator layer 212 and conductive interconnect structures (213, 216, and 217) disposed in and on the substrate 211.

The chip package structure 200 also includes a redistribution layer 215 formed on the interposer 210, in accordance with some embodiments. The redistribution layer 215 includes contact and interconnect structures 213 in dielectric layer 215-1 made of one or more insulating materials, such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The redistribution layer 215 is configured to provide interconnections between chip structures and to the interposer 210.

According to some embodiments, the interposer 210 and redistribution layer 215 are similar to interposer 110 and the redistribution structure 114 described above in connection with FIGS. 1A and 1B. The materials and formation processes described above also applied to the device structures depicted in FIG. 2. In some embodiments, the redistribution layer can be made part of the interposer, as shown in FIGS. 1A and 1B.

The chip package structure 200 also includes IC chip structures 201, 202, and 203 bonded through conductive bumps 207 to redistribution layer 215, which is connected to the interposer 210. The chip structures 201, 202, and 203 can include a chip, such as a system on chip (SoC), in accordance with some embodiments, similar to chip structures 120 and 130 described above in connection to FIGS. 1A and 1B. In some other embodiments, the chip structures 201, 202, and 203 can include a chip package structure including multiple semiconductor dies, similar to the chip structure 140 described above in connection to FIGS. 1A and 1B.

The interposer 210 has two opposite surfaces: a front surface 210a and a back surface 210b. The front surface 210a faces IC chip structures 201, 202, and 203. The back surface 210b is the opposite surface, and faces a package substrate (not shown), in accordance with some embodiments. The interposer 210 includes a substrate 211 and an insulator layer 212 and conductive interconnect structures (214, 216, and 217) disposed in and on the substrate 211. The redistribution layer 215 includes contact and conductive interconnect structures 213 formed in insulator layer 215-1.

The substrate 211 is made of a fiber material, a polymer material, a semiconductor material, a glass material, a metal material, or another suitable material. The fiber material includes, for example, a glass fiber material. The semiconductor material includes, for example, silicon or germanium. Insulating layer 212 is made of a dielectric material suitable for a silicon integrated circuit process, such as silicon oxide or silicon nitride, etc. The substrate 211 also includes conductive structures for electrical connections between various dies and with a package substrate.

For example, these interconnect structures include contact pads 213, through-substrate vias (TSVs) 214, and conductive structures 216 and 217, etc. The interconnect and conductive structures are made of a conductive material, such as metal (e.g. copper, aluminum, or tungsten), in accordance with some embodiments.

The interposer substrate 211 has a thickness ranging from about 50 μm to about 300 μm, in accordance with some embodiments. However, it is understood that the thickness and spacing ranges are only cited as examples, and variations can be made depending on the applications.

The insulating layers 212 and 215-1 is made of an insulating material, such as a polymer material (e.g., polybenzoxazole, polyimide, or a photosensitive material), nitride (e.g., silicon nitride), oxide (e.g., silicon oxide), silicon oxynitride, or the like, in accordance with some embodiments. Other suitable insulating material can also be used. Contact and interconnect structures 213, 216, and 217 are formed in the insulating layers 215-1 and 212, respectively. In some cases, the contact and interconnect structures 213 are formed for connecting the bumps 207 with the interposer 210. The contact and interconnect structures 213 are made of a suitable conductive material, such as metals (e.g. copper, aluminum, or tungsten, etc., or other suitable metals), in accordance with some embodiments. The contact and interconnect structures 213 can also include a surface finish material (e.g., nickel, palladium, and/or gold) or a solder material, such as Sn and Ag or another suitable conductive material, in accordance with some embodiments.

A molding compound material or an underfill material (not shown) is formed between the chip structures 201, 202, and 203 and the contact and interconnect structures 213 and surrounds the bumps 207. The molding compound material and underfill material can include epoxy and filler material, or other suitable materials, in accordance with some embodiments. In some embodiments, the molding layer can surround the interposer 210, the chips 201-203, the conductive bumps 207, and the underfill layer that are disposed on a package substrate as shown in FIGS. 1A and 1B.

In accordance with some embodiments, the interposer 210 includes additional interconnect structures, besides those shown in FIG. 2. For example, the additional interconnect structures can include metal interconnect lines, contact structures, TSVs, etc. formed in dielectric layers. In some embodiments, the interposer 210 includes routing regions 210-1 and non-routing regions 210-2 and 210-3. The interconnect structures are disposed in the routing regions 210-1, and no interconnect structures are disposed in the non-routing regions 210-2 and 210-3. The routing regions have conductive interconnect structures in and on the substrate for connecting to a group of IC dies. The processes for forming the contact and conductive interconnect structures are similar to those described above in connection to FIGS. 1A and 1B.

In accordance with some embodiments, the non-routing regions 210-2 and 210-3 are available for modification without affecting the bonding and interconnection structures of the chip package. For example, the non-routing regions 210-2 can be used for forming stress and warpage relief structures.

As shown in FIG. 2, the group of IC dies is bonded to the interposer 210 through redistribution layer 215 to form an IC chip package 200. The interposer 210 includes a first plurality of warpage-reducing trenches 221 in a first non-routing region 210-2 of the interposer 210. The first plurality of warpage-reducing trenches 221 are characterized by a first trench width W1, first trench spacing S1, first trench depth D1, and first trench length (not shown in FIG. 2). A first warpage-relief material 221-1 is deposited in the first plurality of warpage-reducing trenches 221.

As shown in FIG. 2, the interposer includes a second plurality of warpage-reducing trenches 222 in a second non-routing region 210-3 of the interposer 210. The second plurality of warpage-reducing trenches 222 are characterized by a second trench width W2, second trench spacing S2, second trench depth D2, and second trench length (not shown in FIG. 2). A second warpage-relief material 222-1 is deposited in the second plurality of warpage-reducing trenches 222.

In accordance to some embodiments, the trenches 221 and 222 are sized and positioned and deposited with a stress relief material according to the warpage characteristic of the chip package structure to reduce warpage. Depending on the embodiments, some of the trenches are formed in insulator layer 212, and some of trenches can be formed in insulator layer 212 and extend into substrate 211, depending on trench depth required for warpage relief.

As described below, the trenches can have elongated shapes with long sides perpendicular to a warpage direction in accordance with some embodiments. In some cases, the warpage-relief material comprises a tensile film to counter compressive stress in the interposer. In other cases, the warpage-relief material comprises a compressive film to counter tensile stress in the interposer.

In some embodiments, the first plurality of warpage-reducing trenches 221 includes trenches having elongated shapes with long sides perpendicular to a first direction of a compressive stress in the interposer, and the first warpage-relief material is a tensile film deposited in the first plurality of warpage-reducing trenches.

In some embodiments, the second plurality of warpage-reducing trenches 222 includes trenches having elongated shapes with long sides perpendicular to a second direction of a tensile stress in the interposer, and a second warpage-relief material is a compressive film deposited in the second plurality of warpage-reducing trenches In some embodiments, the tensile film includes a metal film, such as aluminum, copper, tungsten, titanium, or other suitable film, or combination thereof. The compressive film includes a silicon oxide film, a silicon nitride film, or a combination thereof.

In accordance with some embodiments, the warpage-reducing trenches may have different trench widths, trench spacings, trench depths, trench lengths, and trench densities, depending on the warpage characteristics of the interposer, as described in more detail below. In some embodiments, the first and second pluralities of warpage-reducing trenches may have different trench widths, trench spacings, trench depths, trench lengths, and trench densities, For example, Further details of the trench forming process are also explained below.

A chip package structure that includes regions where dies are disposed adjacent to one another is susceptible to warpage after thermal cycling, such as after a reflow process to reflow the solder balls or bumps. In some examples, a coefficient of thermal expansion (CTE) of the dies or encapsulant (e.g., molding compound) and/or other components on the interposer is greater than a CTE of the interposer. Hence, when the chip package structure is heated during a reflow process, the dies and the molding compound can expand a different amount than the interposer. The difference in the amount of expansion can cause warpage of the package.

FIG. 3 shows a top view of an exemplary IC chip package structure and images of measured warpages, in accordance with some embodiments. As shown in FIG. 3, chip package structure 300 includes a processor die 301, and memory dies 311, 312, 313, and 314 bonded to an interposer 320. As described above in FIGS. 1A, 1B, and 2, dies 301 and 311-314 are bonded to interposer 320 using conductive bumps (not seen in FIG. 3).

Chip package structure 300 also shows two rectangular regions, 321 and 322, drawn by broken lines, which indicate high stress regions in chip package structure 300. Rectangular regions 321 and 322, where dies are disposed adjacent to one another, are susceptible to warpage after thermal cycling, such as after a reflow process to reflow the solder balls or bumps. In some examples, a coefficient of thermal expansion (CTE) of the dies or encapsulant (e.g., molding compound) and/or other components on the interposer 320 is greater than a CTE of the interposer 320. Hence, when the package 300 is heated during a reflow process, the dies and the molding compound can expand a different amount than the interposer 320. The difference in the amount of expansion can cause warpage of the chip package structure 300.

In FIG. 3, diagrams 350 and 360 illustrate Shadow Moire images showing warpage in chip package structure 300 before and after a thermal process, in accordance with some embodiments. Shadow Moiré is a non-contact optical technique that uses geometric interference between a reference grating and its shadow on a sample to measure relative vertical displacement at each pixel position in the resulting image. The imaging is produced using a grating, a light source at approximately 45 degrees to the grating, and a camera perpendicular to the grating. A phase stepping technique can be applied to Shadow Moiré to increase measurement resolution and provide automatic ordering of the interference fringes.

In FIG. 3, diagram 350 illustrates a Shadow Moire image of chip package structure 300 showing an upward-bending warpage before a thermal process. Diagram 360 shows a shadow Moire image of chip package structure 300 showing a downward-bending warpage after the thermal process, caused by a compressive stress on the interposer 320. If the stress is sufficiently large, a breakage of the package could occur, as illustrated in FIG. 3. Even if the stress is not large enough to cause breakage, the integrity of the package can be compromised. For example, electrical contact points in the high stress regions can be affected, resulting in increased contact resistance, or even contact failures.

With identification of warpage in the interposer having been illustrated, attention is now directed to FIG. 4, which illustrates an example of selecting materials to deposit in warpage-relieving trenches to strengthen the interposer for addressing the warpage. As can be seen, on the left of FIG. 4, cross-sectional views of a portion of a substrate for an example interposer in accordance with some embodiments. On the right of FIG. 4, a graph of warpage data is shown. In FIG. 4, a structure 410 including a substrate 401 is shown for forming an interposer. As also shown, trenches 402 are formed in the substrate 401 so materials can be deposited in those trenches. In this example, each trench 402 has trench sidewalls 403 and a bottom 405.

In various implementations, the substrate 401 can be made of a fiber material, a polymer material, a semiconductor material, a glass material, a metal material, or any another suitable material. In some embodiments, the substrate 401 is made of a semiconductor material, such as silicon or germanium. To form the trenches, a patterned mask (not shown) is formed on the substrate 401 using patterning and etching process. The mask can be a photoresist mask or a hard mask. In some examples, the hard mask is made of silicon oxide ($SiO_2$), silicon carbon nitride (SiCN), silicon oxycarbide (SiOC), silicon oxycarbon nitride (SiOCN) or silicon nitride (SiN or $Si_3N_4$), or another suitable material. The hard mask is formed using deposition, photolithography, and etching processes. With the patterned mask, the trenches can be etched in the substrate 401. The etching processes may include a reactive ion etch (RIE), neutral beam etch (NBE), inductive coupled plasma (ICP) etch, or another suitable process, or a combination thereof.

As mentioned, for addressing the warpage, a warpage-relief material is selected and formed in the trenches to counteract or reduce the warpage in the interposer substrate caused by the packaging operation. For example, metal tends to have higher thermal expansion coefficients than semiconductors such as silicon, germanium, etc. depending on processing conditions. Dielectrics, such as silicon oxide, silicon nitride, etc., tend to have lower thermal expansion coefficients than semiconductors. Therefore, at room temperature, dielectric films tend to be under compressive stress, or have compressive strains. In contrast, metal films tend to be under tensile stress, or have tensile strains. These properties can be used to deposit different materials in the trenches to affect the warpage. For example, if the chip package structure causes the interposer to exhibit an upward warpage, then the warpage-relief material can be chosen such that after going through the packaging thermal cycle, the warpage-relief material causes the substrate to bend downward to counter the warpage. Similarly, if the chip package structure causes the interposer to exhibit a downward warpage, then the warpage-relief material can be chosen such that after going through the packaging thermal cycle, the substrate is caused to bend downward to counter the warpage.

In FIG. 4, a second structure 420 shows a layer of material 421 deposited on the trench sidewalls 403 and bottom 405. The trenches may be filled with the insulating material using a deposition process, such as chemical vapor deposition (CVD), flowable CVD (FCVD), a spin-on-glass (SOG) process, or another suitable process. The deposition process can be followed by a planarization process, such as a chemical-mechanical polishing (CMP) process or an etching process.

In FIG. 4, diagram 430 shows plots of substrate warpage as a function of the thickness of the material 421 deposited in the trenches, in accordance with some embodiments. In diagram 430, the horizontal axis is the position along the wafer radius. The vertical axis shows the amount of warpage as a function of a thickness of material 421, from 0 to 300 in a normalized unit. In this experiment, the material 421 is silicon oxide. The data points shown in open triangles 431 are for deposited material of a base line thickness, labeled STD. The data points shown in open squares 432 are for the deposited material having a thickness 10% thinner than the base line thickness. The data points shown in open rhombus 433 are for the deposited material having a thickness 20% thinner than the base line thickness. It can be seen from diagram 430 that the deposited silicon oxide material in the trenches appears to exert a stress that causes the substrate to concave downwards. Further, reducing the thickness of the deposited material appears to reduce the extent of warpage.

Figure 5:
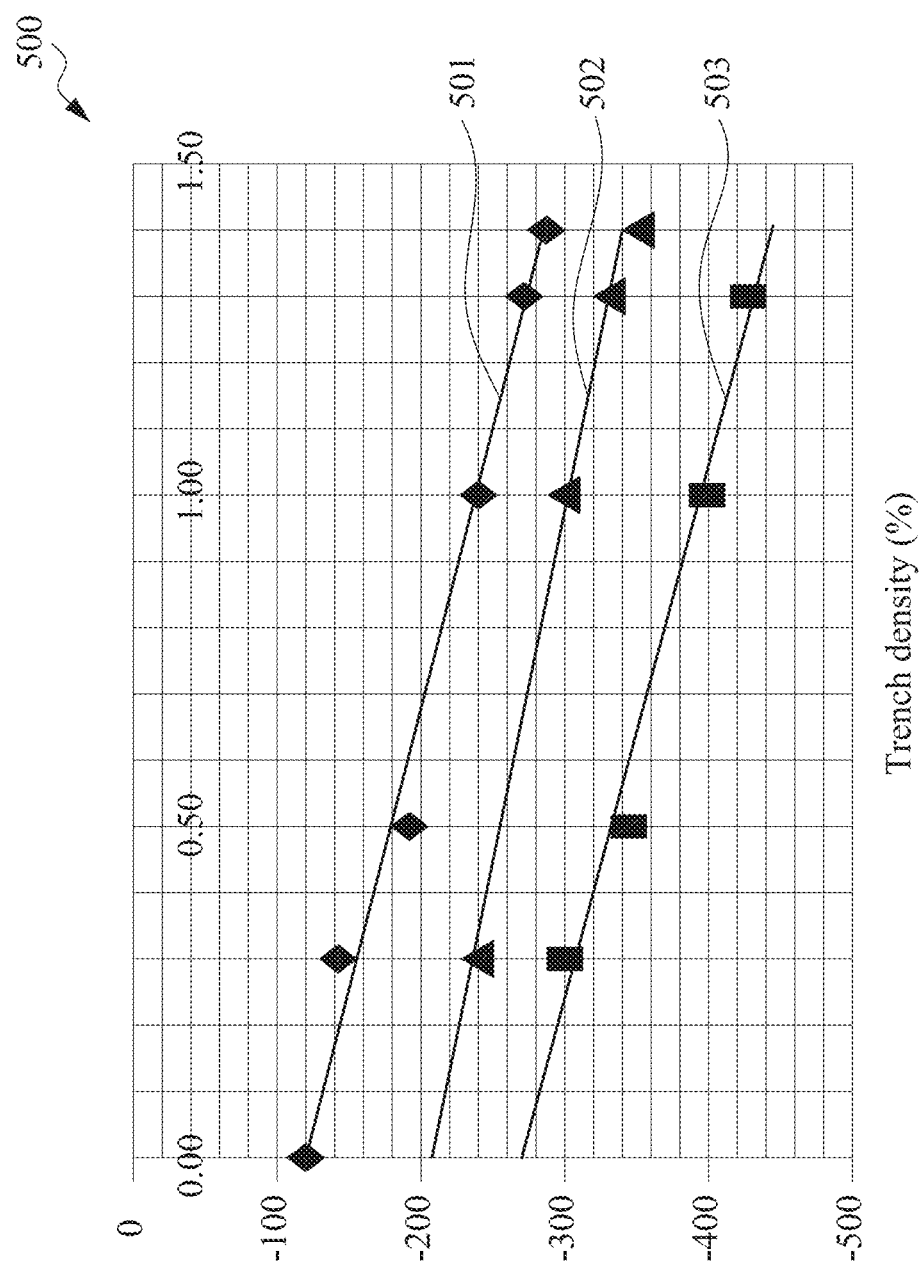
FIG. 5 shows a diagram illustrating substrate warpage as a function of the trench density, in accordance with some embodiments.

FIG. 5 shows a diagram 500 illustrating substrate warpage as a function of the trench density, in accordance with some embodiments. In diagram 500, the horizontal axis is the trench density in percentage (%), in a normalized unit. The vertical axis shows the amount of warpage as a function of the trench density, in another normalized unit. The data points shown in rhombus 501 illustrate the increase in warpage magnitude with increasing trench percentage after the formation of the trenches. The data points shown in triangles 502 illustrate the increase in warpage magnitude with increasing trench percentage after the trenches are filled with TaN. The data points shown in rectangles 503 illustrate the increase in warpage magnitude with increasing trench percentage after the trenches are filled with TiN. It can be seen from diagram 500 that the amount of warpage can be adjusted with trench density and the trench-relief material formed inside the trenches.

Figure 6:
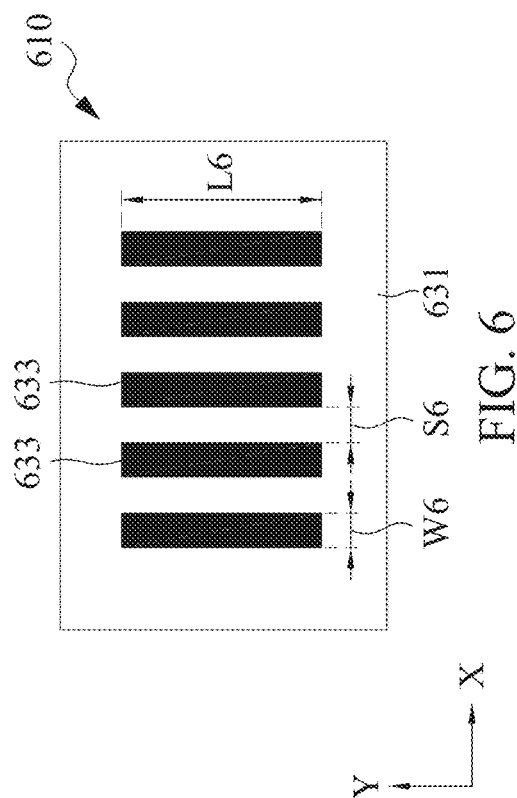
FIG. 6 is an example of disposing trenches in a substrate to reduce warpage, in accordance with some embodiments.

FIG. 6 shows an example of trenches in a substrate to reduce warpage, in accordance with some embodiments. In FIG. 6, diagram 610 is a top view of a substrate 631 with trenches 633 disposed in the substrate 631. As shown, the trenches 633 in substrate 631 are formed to have elongated shapes with long sides perpendicular to the warpage direction, which is the X-direction in this example. As an example, the warpage direction in the X-direction is characterized by the Shadow Moire images in diagrams 350 and 360 in FIG. 3. Diagram 350 shows a downward-bending warpage along the X direction, and diagram 360 shows an upward-bending warpage along the X direction. The trenches are sized and shaped based on the warpage characteristic of the chip package structure. Trenches 633 are warpage-reducing trenches formed in a non-routing region of the substrate 631. The plurality of warpage-reducing trenches 633 are characterized by a trench width W6, trench spacing S6, trench length L6, and trench depth (not shown in FIG. 6).

Figure 7:
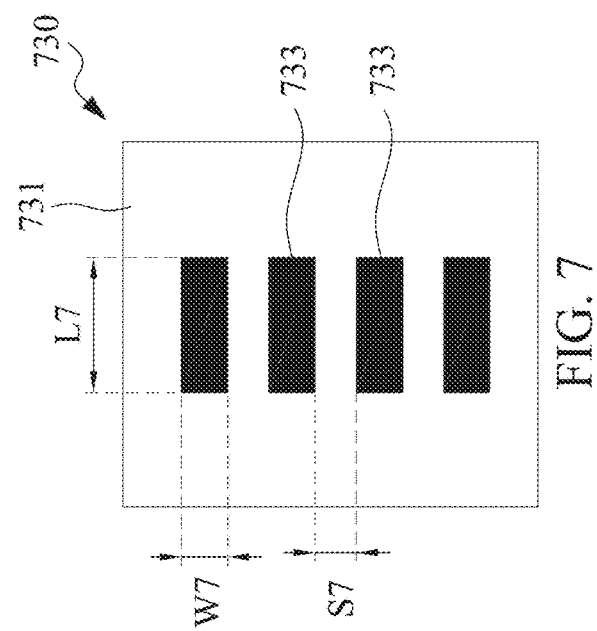
FIG. 7 is another example of disposing trenches in a substrate to reduce warpage, in accordance with some embodiments.

FIG. 7 shows an example of trenches in a substrate to reduce warpage, in accordance with some embodiments. In FIG. 7, diagram 730 is a top view of a substrate 731 with trenches 733 disposed in the substrate 731. As shown, the trenches 733 in substrate 731 are formed to have elongated shapes with long sides perpendicular to the warpage direction, which is the Y-direction in this example. In this example, the warpage direction is determined to be in the X-direction as characterized by the Shadow Moire images The trenches are sized and shaped based on the warpage characteristic of the chip package structure. Trenches 733 are warpage-reducing trenches formed in a non-routing region of the substrate 731. The plurality of warpage-reducing trenches 733 are characterized by a trench width W7, trench spacing S7, trench length L7, and trench depth (not shown in FIG. 7).

As described above, The trenches are sized and shaped based on the warpage characteristic of the chip package structure. The trench width, trench spacing, trench length, and trench depth can be selected based on the warpage characteristic of the chip package structure. For example, in some embodiments, the trench width W6 and W7 is in a range between 5 μm and 20 μm, for example 12 μm. The trench spacing S6 and S7 is in a range between 20 μm and 120 μm, for example=80 um. The trench length L6 and L7 is in a range between 10 μm and 2000 μm, for example=400 um. Further, the trench depth can be in a range between 5 μm and 250 μm, for example, 70 μm. Further, the global density of trenches can be increased to increase warpage effect.

Further, the warpage-relief material disposed in the trenches and the thickness of the film are also selected and determined based on the warpage characteristic of the chip package structure, for example, in accordance with principles shown in FIG. 4. In various implementations, the warpage-relief material can be a compressive film to counter tensile stress in the chip package structure, and the warpage-relief material can be a tensile film to counter compressive stress in the chip package structure.

Figure 8:
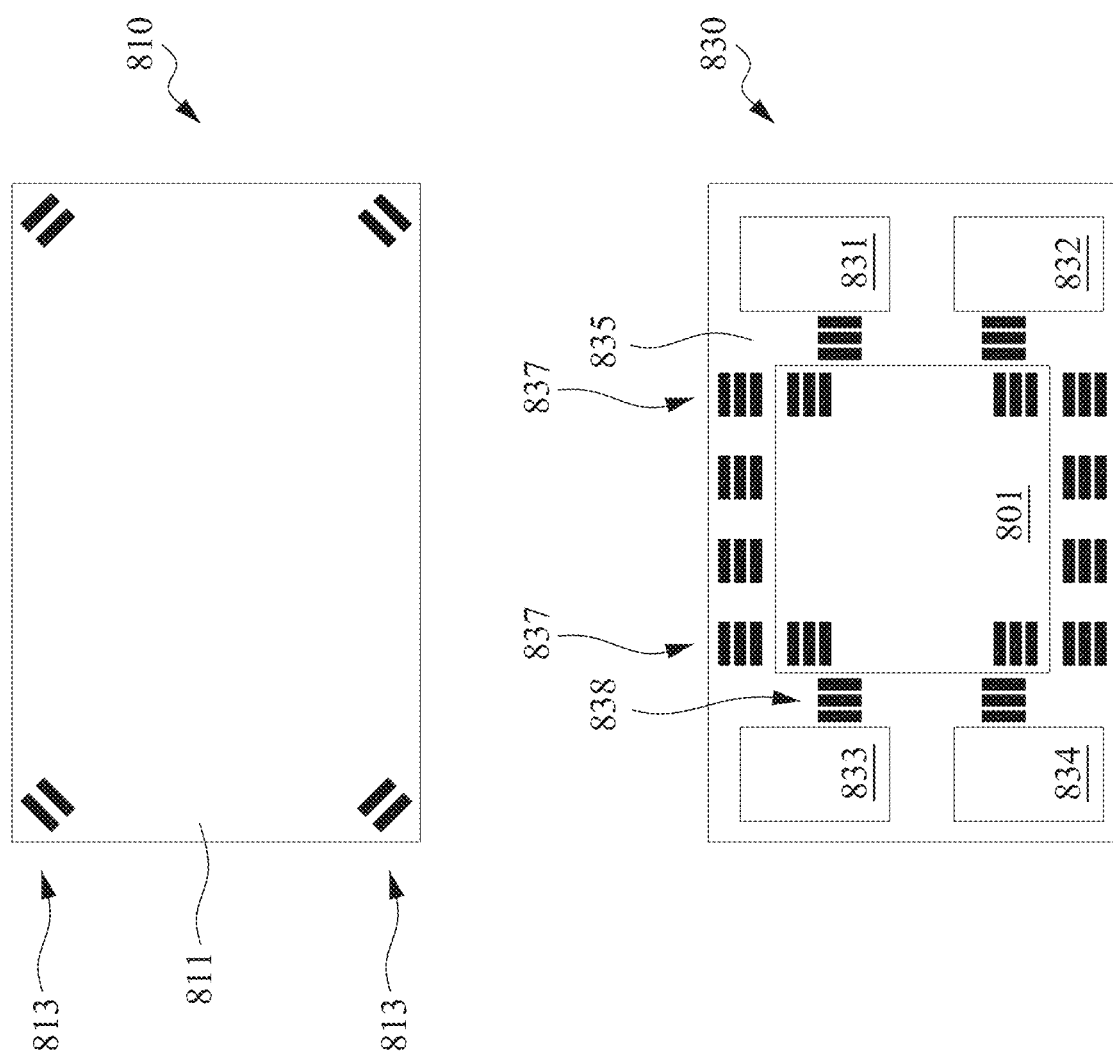
FIG. 8 shows additional examples of disposing trenches in a substrate to reduce warpage, in accordance with some embodiments.

FIG. 8 shows additional examples of forming trenches in a substrate to reduce warpage, in accordance with some embodiments. In FIG. 8, diagram 810 is a top view of a substrate 811 with trenches 813 disposed in the substrate 811. In diagram 810, trenches 813 are placed at corners of substrate 811 based on the warpage characteristic of the chip package structure, which indicates that warpage occurs at the corner. Therefore, the trenches are disposed at the corners, and a warpage relief material is deposited to reduce the warpage. In this example, a plurality of trenches 813 are formed near the corners of the substrate to counter the warpage at the corners of the substrate. For example, the trenches 813 are formed at an angle to the sides of the substrate adjacent to the corners. In some embodiments, the angle is between 30 to 70 degrees, for example 45 degrees. The trench width, trench spacing, trench length, trench depth, and trench density can be selected based on the warpage characteristic of the chip package structure. Depending on the embodiments, the trench width is in a range between 5 μm and 20 μm, for example 12 μm. The trench spacing is in a range between 20 μm and 120 μm, for example=80 um. The trench length is in a range between 10 μm and 2000 μm, for example=400 um. Further, the trench depth is in a range between 5 μm and 250 μm, for example, 70 μm, in accordance with some embodiments. Further, the global density of trenches can be increased to increase warpage effect.

Diagram 830 is a top view of a chip package structure, similar to chip package structure 300 in FIG. 3, which includes a processor die 801, labeled as CPU, and memory dies 831, 832, 833, and 834 bonded to an interposer 835. Diagram 830 also shows trenches 837 and 838 disposed on interposer 835 in non-routing regions, where there are no conductive interconnect structures and where spaces are available on the interposer to relieve warpage based on the warpage characteristic of the chip package structure.

For example, trenches 837 are formed to have elongated rectangles oriented horizontally between an edge of die 801 and an edge of the interposer 835. In some embodiments, the length of the trenches is a fraction of the length of the edge of die 801, for example from 10% to 70%. In some cases, the length of the trenches is a 25% of the length of the edge of die 801.

As another example, trenches 838 are formed to have elongated rectangles oriented horizontally between die 801 and die 833. In some embodiments, the length of the trenches is a fraction of the length of the space between two dies 801 and 833, for example from 10% to 70%. In some cases, the length of the trenches is a 25% of the length of the space between two dies 801 and 833.

As illustrated in the above examples, a method is provided for forming an integrated circuit (IC) chip package structure. The method includes providing a substrate for an interposer, in accordance with some embodiment. The method also includes forming trenches in the substrate of the interposer, wherein the trenches are sized and positioned based on a warpage characteristic to reduce the warpage of the chip package structure. The method further includes depositing a warpage-relief material in the trenches according to the warpage characteristic to reduce the warpage of the chip package structure. The method includes forming a conductive interconnect structure in and on the substrate for connecting a group of selected IC dies. The method also includes bonding the group of the selected IC dies to the interposer to form a chip package structure.

In accordance to some embodiments, the warpage characteristic of the chip package structure can be determined empirically by measuring the warpage of a chip package structure. For example, such measurement can be performed using a Shadow Moire method. Alternatively, in some embodiments, the warpage characteristic can be determined based on physical analysis and computer simulation. An example of a method based on the empirical approach is described below with reference to FIG. 9.

Figure 9:
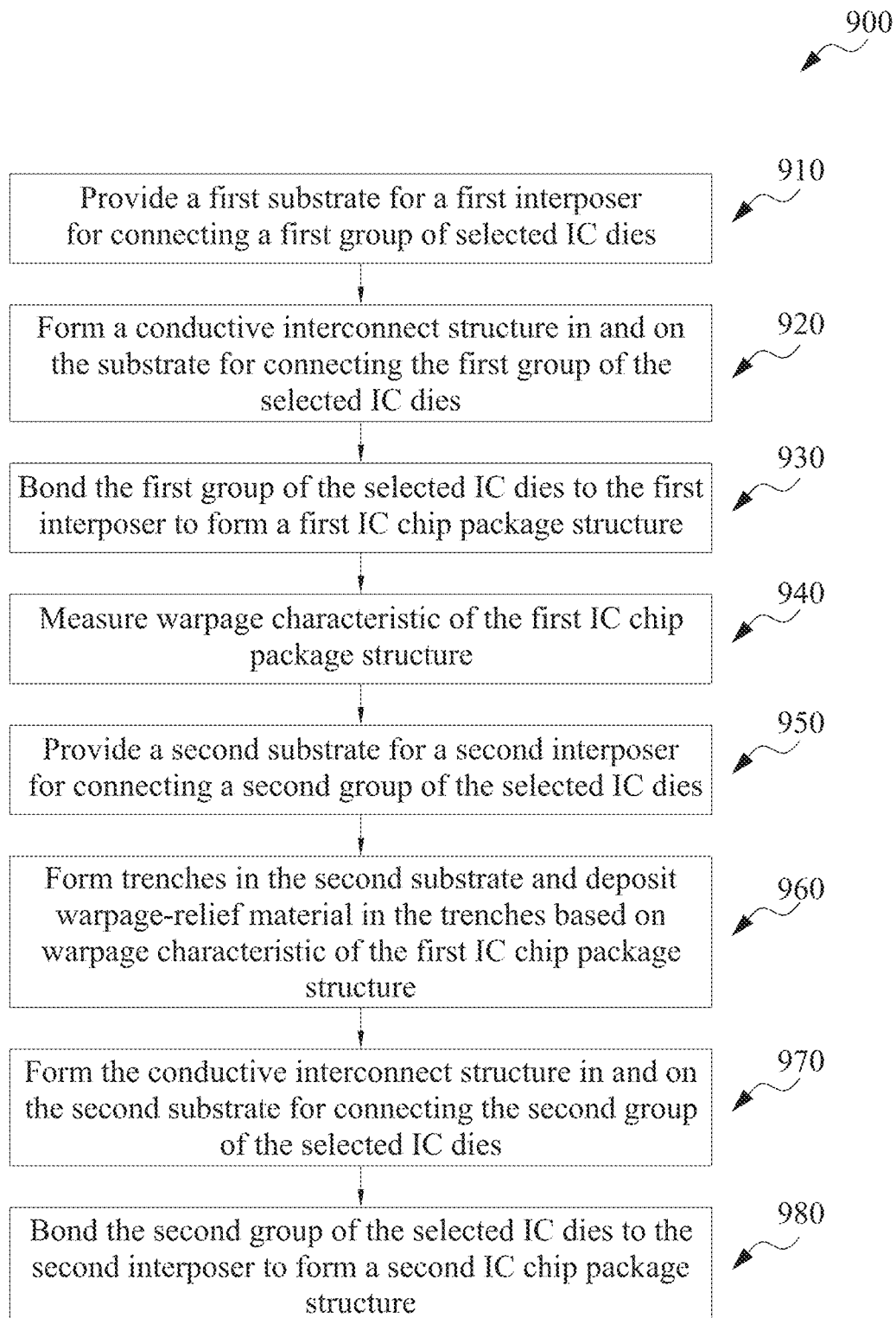
FIG. 9 is a flowchart for a method for forming an integrated circuit (IC) chip package structure, in accordance with some embodiments.

FIG. 9 is a flowchart for a method for forming an integrated circuit (IC) chip package structure, in accordance with some embodiments. As shown in FIG. 9, method 900 describes a method for forming a chip package structure with warpage-relief trench structures in the interposer substrate. The operations in method 900 are briefly summarized below with reference to FIGS. 1-8 described above, and additional information provided in FIGS. 10-14. It is noted that method 900 as described below may not include all the details to produce a complete semiconductor device. Accordingly, additional processes can be provided before, during, and after those described in method 900. It is also understood that the operations in method 900 can be performed in a different order, or some operations not performed, depending on specific applications.

Briefly, method 900 includes determining a warpage characteristic of a chip package structure including a first group of selected IC dies bonded to a first interposer without the trenches. The trench structures and warpage-relief materials are formed in a second interposer, before a second group of selected IC dies are bonded to the second interposer.

As shown in FIG. 9, in operation 910, the method includes providing a first substrate for a first interposer for connecting a first group of selected IC dies. An example of a chip package structure including a group of selected IC dies on an interposer is shown in FIG. 2, in which chip package structure 200 includes IC chip structures 201, 202, and 203 bonded to an interposer 210. The group of selected IC dies in IC chip structures 201, 202, and 203 can include processors, systems-on-chip, or memory chips. The interposer 210 includes a substrate 211.

In operation 920, a conductive interconnect structure is formed in and on the substrate for connecting the first group of the selected IC dies. An example of the conductive interconnect structure is shown in FIG. 2, where the interconnect structures include through-silicon vias (TSVs) 215, contact pads 216, and interconnect structures 217. The interconnect and conductive structures are made of a conductive material, such as metal (e.g. copper, aluminum, or tungsten), in accordance with some embodiments. The conductive interconnect structure can also include contact and interconnect structures 213 formed in insulating layer 212 on substrate 211.

In operation 930, the method includes bonding the first group of the selected IC dies to the first interposer to form a first IC chip package structure. As shown in FIG. 2, chip structures 201, 202, and 203 are bonded to the interposer 210 by bumps 207. In some embodiments, the bonding operation also includes forming a molding compound material or an underfill material between the chip structures 201, 202, and 203 and the contact and interconnect structures 213 and surrounding the bumps 207, as described above in connection to FIG. 2.

Method 900 also includes, in operation 940, determining warpage characteristic of the first IC chip package structure. Examples of chip package structure warpage are shown in FIGS. 3 and 4. As shown in FIG. 3, chip package structure 300 includes a CPU die 301 and memory dies 311, 312, 313, and 314 bonded to an interposer 320. Chip package structure 300 also shows two rectangular regions, 321 and 322, drawn by broken lines, that indicate high stress regions in chip package structure 300. The different materials in the package can have residual strains from the fabrication processes. When the package 300 is heated up and cooled down during a reflow process, the components can expand or contract differently, which can cause warpage or even breakage of the package 300. In FIG. 3, diagrams 350 and 360 illustrate Shadow Moire images showing warpage in chip package structure 300 before and after a thermal process, in accordance with some embodiments. The amount of warpage can be determined by Shadow Moire imaging method or other suitable method. As described below, the warpage characteristic is used in modifying the interposer substrate to reduce the warpage.

In operation 950, a second substrate is provided for a second interposer for connecting a second group of the selected IC dies. As described above regarding the first substrate, the substrate can be a suitable material. In some embodiments, the substrate is a silicon substrate.

In operation 960, trenches are formed in the second substrate and a layer of warpage-relief material is deposited in the trenches based on the warpage characteristic of the first IC chip package structure. The trenches are sized and positioned based on a warpage characteristic to reduce the warpage of the chip package structure. FIGS. 6-8 shows examples of determining the sizes and shapes of the trenches based on the warpage characteristic determined in operation 950. For example, in some embodiments, trenches are formed in the substrate that are aligned perpendicular to a direction of warpage. If the warpage occurs in the X-direction, then trenches that are elongated in the Y-direction can be used. Similarly, if the warpage occurs in the Y-direction, then trenches that are elongated in the X-direction can be used. Further, the number, size, and position of the trenches can be determined based on the warpage characteristic.

Different materials can be deposited in the trenches. For example, the warpage-relief material can be deposited in one or more trenches. In some cases, a tensile material can be deposited to counter compressive stress in the IC chip package structure. Similarly, a compressive material can be deposited to counter tensile stress in the IC chip package structure. Here, tensile materials refer to a material, e.g., a metal, that exhibits tensile strains or under tensile stress at room temperature. Similarly, compressive materials, e.g., a dielectric, refers to material that exhibits compressive strains or under compressive stress at room temperature. The thickness of the warpage-relief material can be varied based on the warpage characteristic. FIG. 5 illustrates the effect of varying the thickness of the material deposited in the trenches on the amount of warpage.

The design of the trenches can be determined empirically, through physical analysis, or simulation, in accordance with some embodiments. A process of forming the trenches is described below with reference to FIG. 10. Variations of trench structures are described below with reference to FIGS. 11-12.

In operation 970, the conductive interconnect structures are formed in and on the second substrate for connecting the second group of the selected IC dies. Here, the process of forming the conductive interconnect structure is similar to the process described above in connection to operation 920.

It is noted that, even though operation 960 of forming trenches and operation 970 of forming conductive interconnect structures are described sequentially, the detailed fabrication steps can be adjusted in different embodiments. For example, different components of the conductive interconnect structures can be formed before or after forming the warpage-relief trenches. For example, in some cases, the trenches can be formed in the substrate first. In other cases, TSVs in the conductive interconnect structures can be formed before the warpage-relief trenches are formed.

Figure 13:
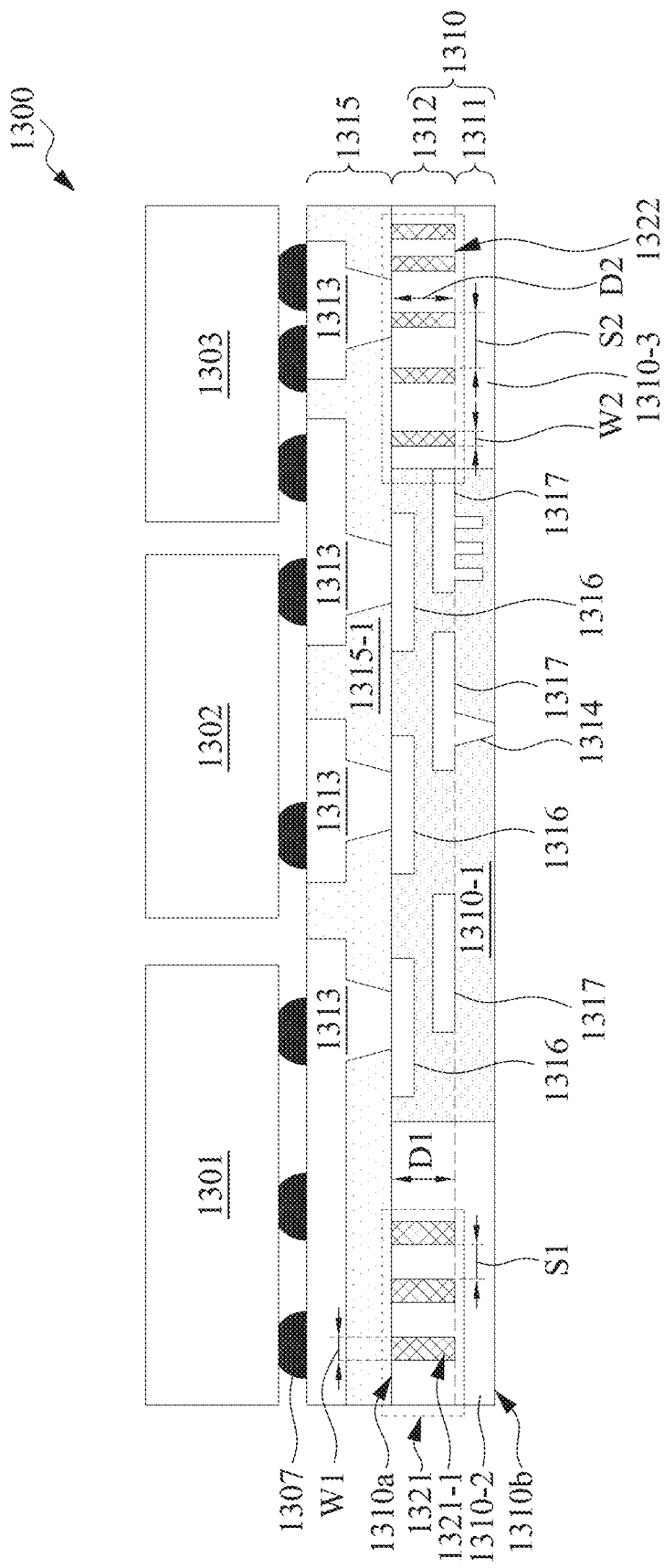
FIG. 13 is an exemplary IC chip package structure having an interposer with warpage-reducing, in accordance with some embodiments.
Figure 14:
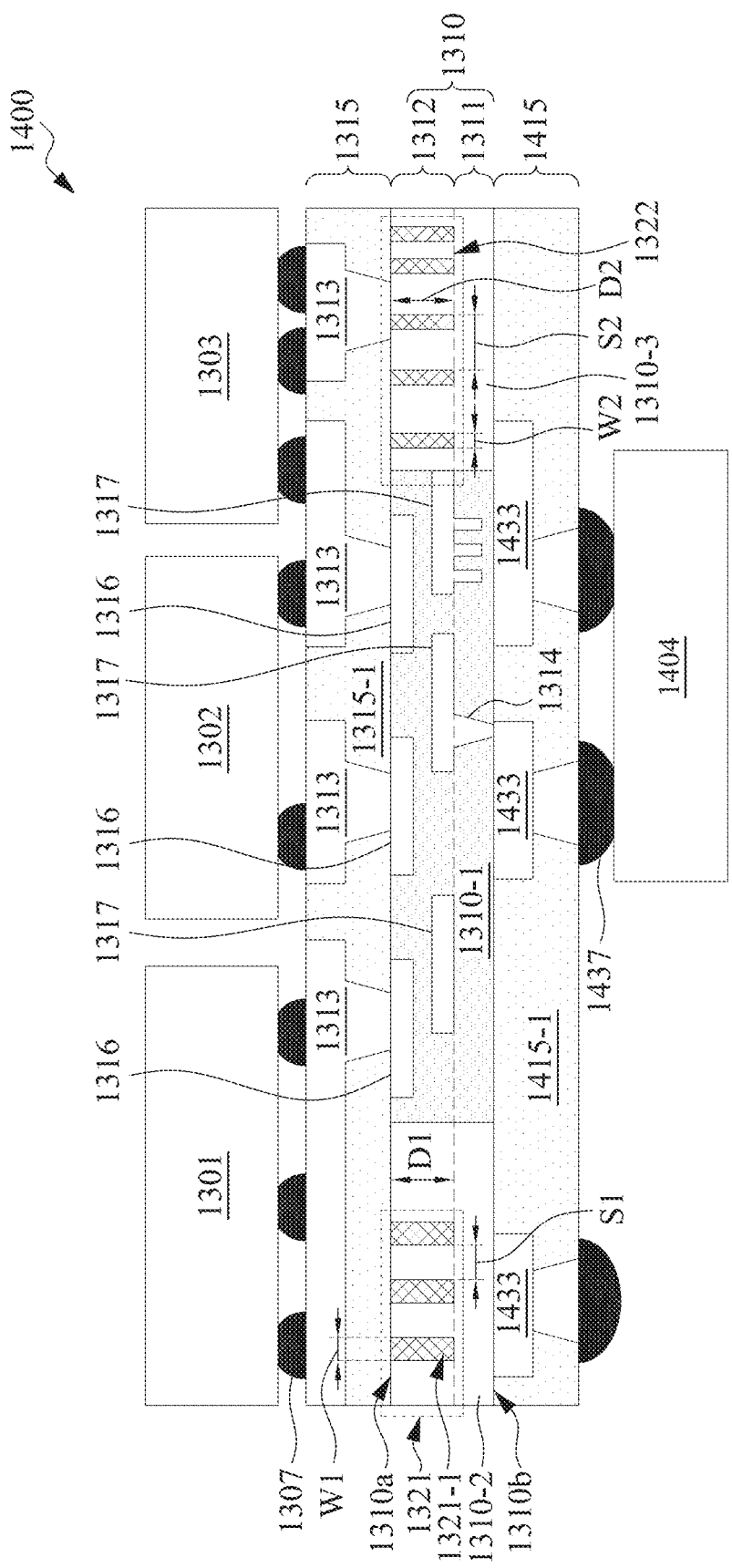
FIG. 14 is a cross-sectional view of another exemplary IC chip package structure having an interposer with trenches for reducing warpage, in accordance with some embodiments.

In operation 980, the second group of the selected IC dies are bonded to the second interposer to form a second IC chip package structure. Here, the process of forming the conductive interconnect structure is similar to the process described above in connection to operation 930. FIGS. 13 and 14 illustrate examples of IC chip package structures built on interposers with built-in warpage relief trenches.

Figure 10:
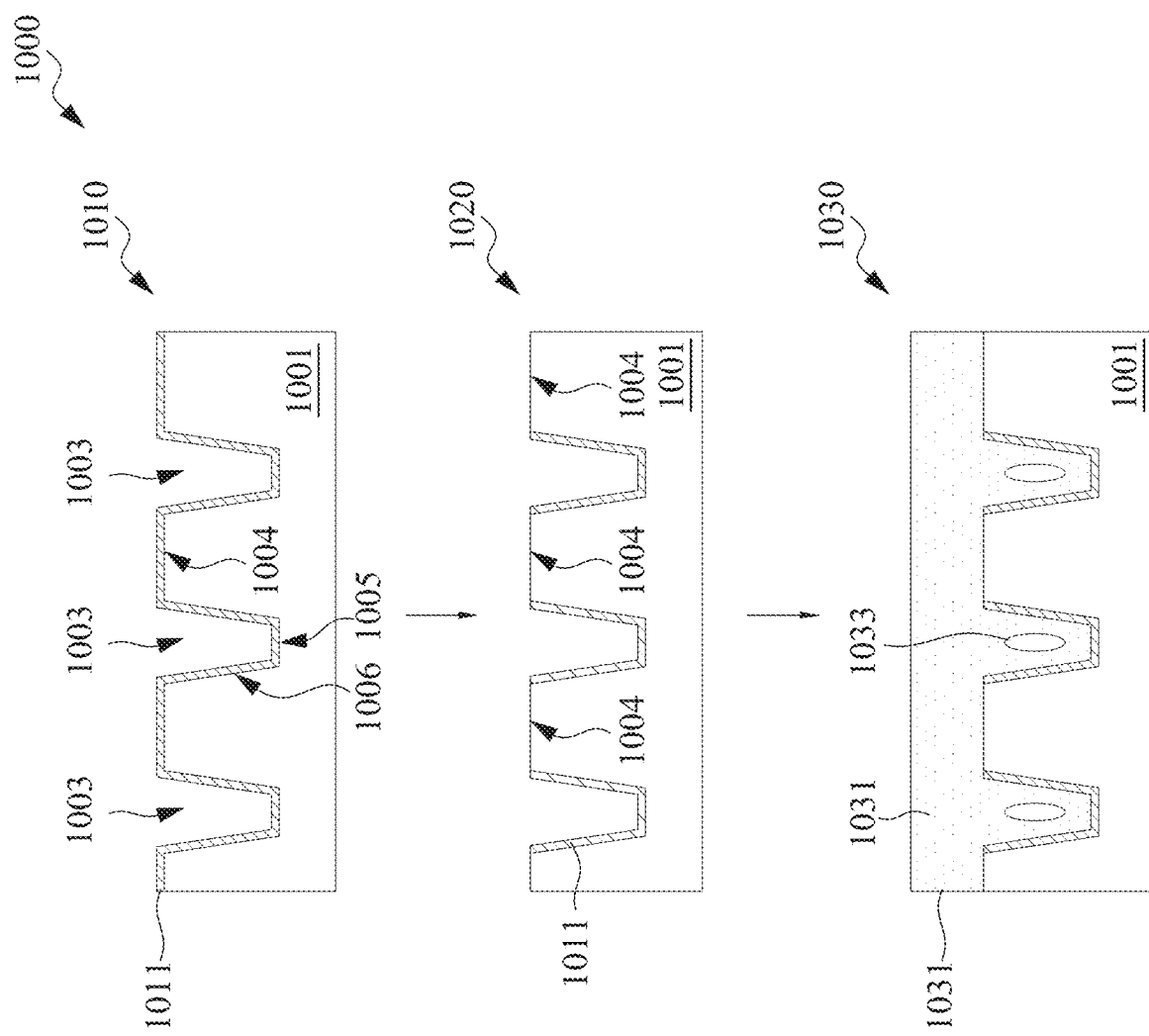
FIG. 10 presents cross-sectional views illustrating a method for forming trenches in an interposer, in accordance with some embodiments.

FIG. 10 presents cross-sectional views illustrating a method for forming trenches in an interposer, in accordance with some embodiments. As shown in FIG. 10, method 1000 illustrates a method for forming trenches in a substrate of an interpose for relieving warpage in a chip package structure. The method includes forming trenches and disposing a warpage-relief material in the trenches.

At operation 1010, the method starts with forming a substrate 1001 for an interposer. Substrate 1001 can be made of a fiber material, a polymer material, a semiconductor material, a glass material, a metal material, or any another suitable material. In the embodiments described herein, the semiconductor material includes, for example, silicon or germanium. In some embodiments, the substrate is a silicon substrate.

Next, trenches 1003 are formed in substrate 1001. To form the trenches 1003, a patterned mask (not shown) is formed on the substrate 1001 using patterning and etching processes. The mask can be a photoresist mask or a hard mask. In some examples, the hard mask is made of silicon oxide (SiO$_2$), silicon carbon nitride (SiCN), silicon oxycarbide (SiOC), silicon oxycarbon nitride (SiOCN) or silicon nitride (SiN or Si$_3$N$_4$), or another suitable material. The hard mask is formed using deposition, photolithography, and etching processes. With the patterned mask, the trenches 1003 can be etched in the substrate 1001. The etching processes may include a reactive ion etch (RIE), neutral beam etch (NBE), inductive coupled plasma (ICP) etch or another suitable process, or a combination thereof. As shown in FIG. 10, each trench 1003 has a top surface 1004, a bottom surface 1005, and sidewalls 1006. Further, a warpage-relief material 1011 is disposed in trenches 1003. The warpage-relief material 1011 can be selected as described above in connection with FIGS. 5 and 9. The deposition process can be a chemical vapor deposition (CVD), flowable CVD (FCVD), a spin-on-glass (SOG) process, or another suitable process.

At operation 1020, excess warpage-relief material 1011 from the top surface 1004 of the trenches is removed using a planarization process, such as a CMP process or an etching process.

At operation 1030, a molding or underfill material 1031 is formed to cover the structure in operation 1020. The molding compound material and underfill material can include epoxy and filler material, or other suitable materials, in accordance with some embodiments. The molding or underfill material can substantially fill the space in the trenches to provide a low step coverage and a flat surface for a subsequent bump process. In some embodiments, small voids 1033 can remain in the molding or underfill material 1031.

Figure 11:
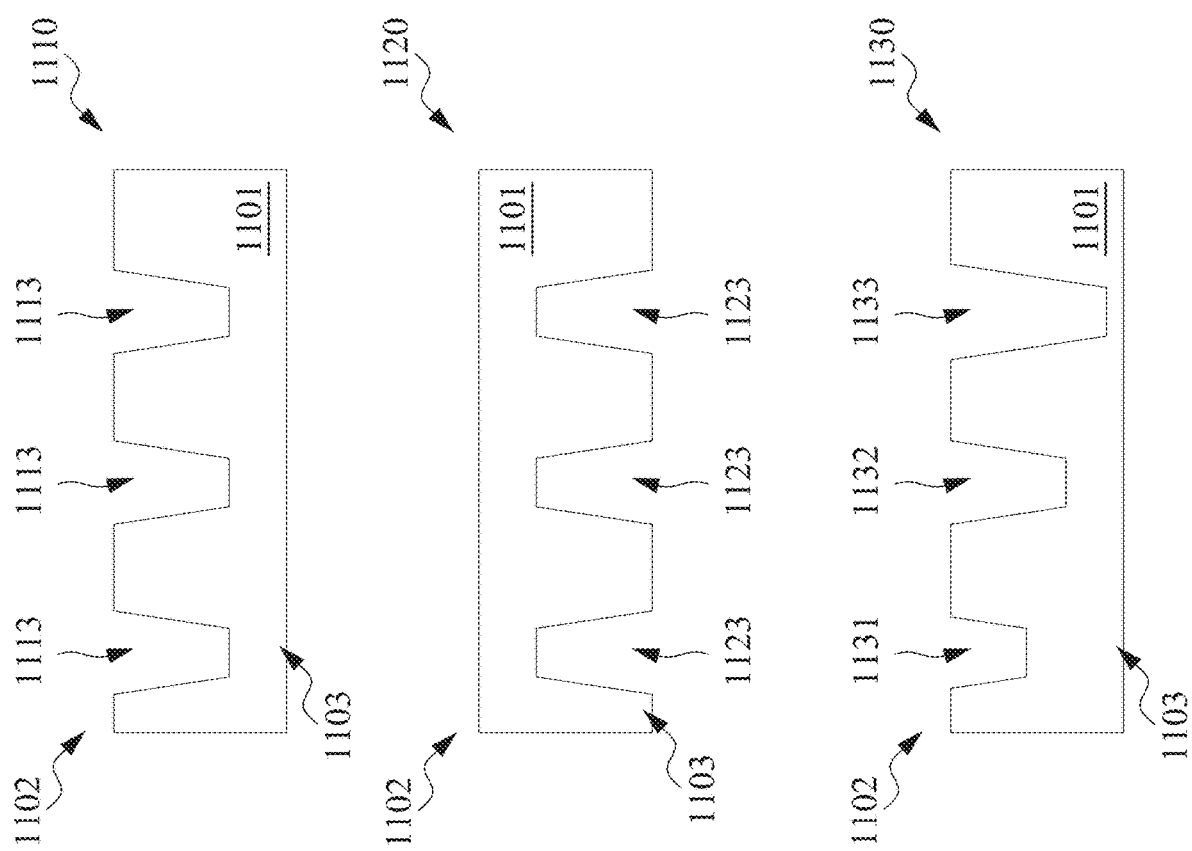
FIG. 11 shows cross-sectional views of alternative methods for forming trenches in an interposer, in accordance with some embodiments.

FIG. 11 presents cross-sectional views of methods for forming trenches in an interposer, in accordance with some embodiments. FIG. 11 shows three substrate structures that have different designs of trench structures. In FIG. 11, structure 1110 shows a substrate 1101 having a top surface 1102 and a back surface 1103. Trenches 1113 are formed from the top surface 1102 of substrate 1101.

Structure 1120 shows a substrate 1101 having a top surface 1102 and a back surface 1103. Trenches 1123 are formed from the top surface 1102 of substrate 1101. In this structure, the warpage-relief material will have an opposite effect as the same warpage-relief material disposed in the trenches formed from the top surface of the substrate.

Structure 1130 shows a substrate 1101 having a top surface 1102 and a back surface 1103. Trenches 1131, 1132, and 1133 are formed from the top surface 1102 of substrate 1101. It is noted that trenches 1131, 1132, and 1133 have different depths.

Figure 12:
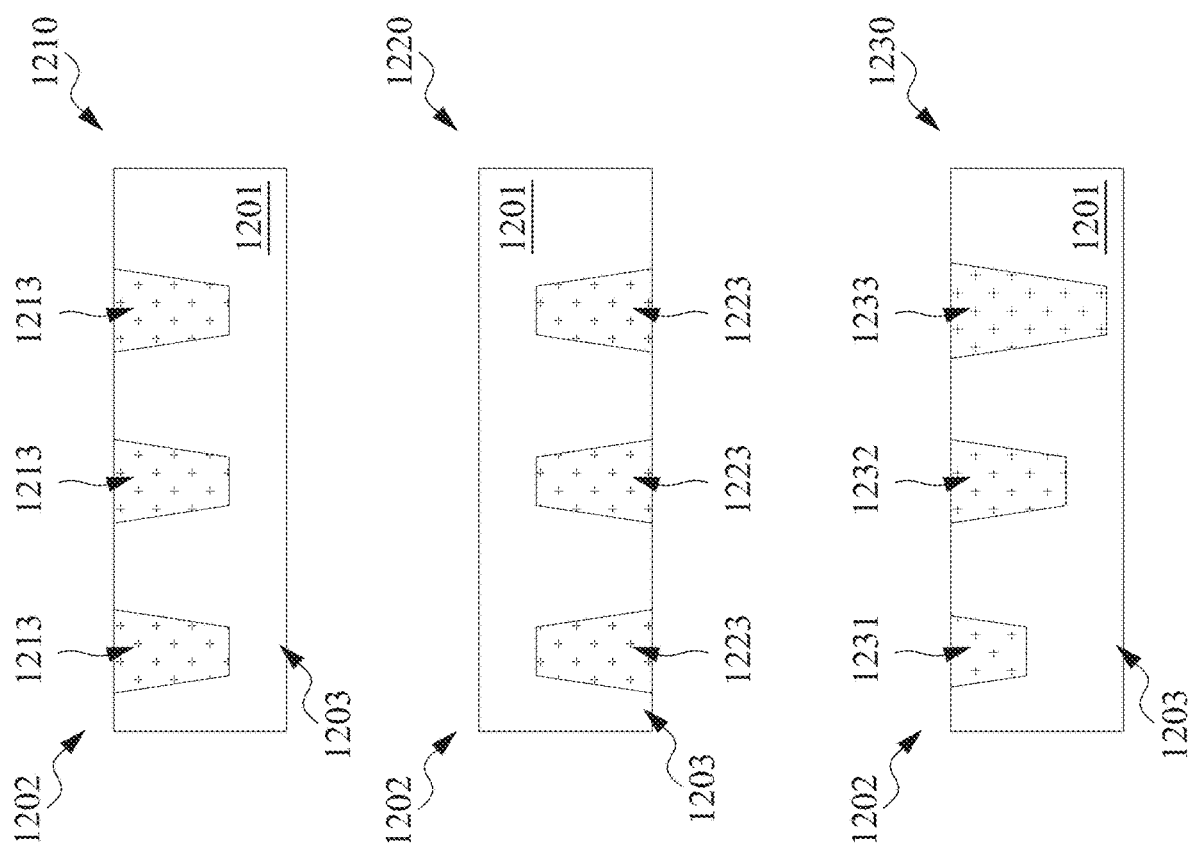
FIG. 12 are cross-sectional views of additional methods for forming trenches in an interposer, in accordance with some embodiments.

FIG. 12 are cross-sectional views of additional methods for forming trenches in an interposer, in accordance with some embodiments. Similar to FIG. 11, FIG. 12 shows three substrate structures that have different designs of trench structures. Unlike, FIG. 11, however, the trench structures in FIG. 12 are substantially filled with a material characterized by a higher hardness than the substrate material. Examples of such materials include silicon carbide (SiC), diamond, etc., or other suitable materials. The increased hardness and rigidity can reduce warpage caused by the packaging materials and processes.

Structure 1210 shows a substrate 1201 having a top surface 1202 and a back surface 1203. Trenches 1213 are formed from the top surface 1202 of substrate 1201. Structure 1220 shows a substrate 1201 having a top surface 1202 and a back surface 1203. Trenches 1223 are formed from the top surface 1202 of substrate 1201. Structure 1230 shows a substrate 1201 having a top surface 1202 and a back surface 1203. Trenches 1231, 1232, and 1233 are formed from the top surface 1202 of substrate 1201. It is noted that trenches 1231, 1232, and 1233 have different depths.

FIG. 13 is an exemplary IC chip package structure having an interposer with trenches for reducing warpage, in accordance with some embodiments. As shown in FIG. 13, an integrated circuit (IC) chip package structure 1300 includes an interposer 1310 having a substrate 1311 and an insulator layer 1312 and conductive interconnect structures (1313, 1316, and 1317) disposed in and on the substrate 1311.

The chip package structure 1300 also includes a redistribution layer 1315 formed on the interposer 1310, in accordance with some embodiments. The redistribution layer 1315 includes contact and interconnect structures 1313 in dielectric layer 1315-1 made of one or more insulating materials, such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The redistribution layer 1315 is configured to provide interconnections between chip structures and to the interposer 1310.

According to some embodiments, the interposer 1310 and redistribution layer 1315 are similar to interposer 110 and the redistribution structure 114 described above in connection with FIGS. 1A and 1B. The materials and formation processes described above also applied to the device structures depicted in FIG. 3. In some embodiments, the redistribution layer can be made part of the interposer, as shown in FIGS. 1A and 1B.

The chip package structure 1300 also includes IC chip structures 1301, 1302, and 1303 bonded through conductive bumps 1307 to redistribution layer 1315, which is connected to the interposer 1310. The chip structures 1301, 1302, and 1303 can include a chip, such as a system on chip (SoC), in accordance with some embodiments, similar to chip structures 120 and 130 described above in connection to FIGS. 1A and 1B. In some other embodiments, the chip structures 1301, 1302, and 1303 can include a chip package structure including multiple semiconductor dies, similar to the chip structure 140 described above in connection to FIGS. 1A and 1B.

The interposer 1310 has two opposite surfaces: a front surface 1310*a* and a back surface 1310*b*. The front surface 1310*a* faces IC chip structures 1301, 1302, and 1303. The back surface 1310*b* is the opposite surface, and faces a package substrate (not shown), in accordance with some embodiments. The interposer 1310 includes a substrate 1311 and an insulator layer 1312 and conductive interconnect structures (1314, 1316, and 1317) disposed in and on the substrate 1311. The redistribution layer 1315 includes contact and conductive interconnect structures 1313 formed in insulator layer 1315-1.

The substrate 1311 is made of a fiber material, a polymer material, a semiconductor material, a glass material, a metal material, or another suitable material. The fiber material includes, for example, a glass fiber material. The semiconductor material includes, for example, silicon or germanium. Insulating layer 1312 is made of a dielectric material suitable for a silicon integrated circuit process, such as silicon oxide or silicon nitride, etc. The substrate 1311 also includes conductive structures for electrical connections between various dies and with a package substrate.

For example, these interconnect structures include contact pads 1313, through-substrate vias (TSVs) 1314, and conductive structures 1316 and 1317, etc. The interconnect and conductive structures are made of a conductive material, such as metal (e.g. copper, aluminum, or tungsten), in accordance with some embodiments.

The interposer substrate 1311 has a thickness ranging from about 50 μm to about 300 μm, in accordance with some embodiments. However, it is understood that the thickness and spacing ranges are only cited as examples, and variations can be made depending on the applications.

The insulating layers 1312 and 1315-1 is made of an insulating material, such as a polymer material (e.g., polybenzoxazole, polyimide, or a photosensitive material), nitride (e.g., silicon nitride), oxide (e.g., silicon oxide), silicon oxynitride, or the like, in accordance with some embodiments. Other suitable insulating material can also be used. Contact and interconnect structures 1313, 1316, and 1317 are formed in the insulating layers 1315-1 and 1312, respectively. In some cases, the contact and interconnect structures 1313 are formed for connecting the bumps 1307 with the interposer 1310. The contact and interconnect structures 1313 are made of a suitable conductive material, such as metals (e.g. copper, aluminum, or tungsten, etc., or other suitable metals), in accordance with some embodiments. The contact and interconnect structures 1313 can also include a surface finish material (e.g., nickel, palladium, and/or gold) or a solder material, such as Sn and Ag or another suitable conductive material, in accordance with some embodiments.

A molding compound material or an underfill material (not shown) is formed between the chip structures 1301, 1302, and 1303 and the contact and interconnect structures 1313 and surrounds the bumps 1307. The molding compound material and underfill material can include epoxy and filler material, or other suitable materials, in accordance with some embodiments. In some embodiments, the molding layer can surround the interposer 1310, the chips 1301-1303, the conductive bumps 1307, and the underfill layer that are disposed on a package substrate as shown in FIGS. 1A and 1B.

In accordance with some embodiments, the interposer 1310 includes additional interconnect structures, besides those shown in FIG. 13. For example, the additional interconnect structures can include metal interconnect lines, contact structures, TSVs, etc. formed in dielectric layers. In some embodiments, the interposer 1310 includes routing regions 1310-1 and non-routing regions 1310-2 and 1310-3. The interconnect structures are disposed in the routing regions 1310-1, and no interconnect structures are disposed in the non-routing regions 1310-2 and 1310-3. The routing regions have conductive interconnect structures in and on the substrate for connecting to a group of IC dies. The processes for forming the contact and conductive interconnect structures are similar to those described above in connection to FIGS. 1A and 1B.

In accordance with some embodiments, the non-routing regions 1310-2 and 1310-3 are available for modification without affecting the bonding and interconnection structures of the chip package. For example, the non-routing regions 1310-2 can be used for forming stress and warpage relief structures.

As shown in FIG. 13, the group of IC dies is bonded to the interposer 1310 through redistribution layer 1315 to form an IC chip package 1300. The interposer 1310 includes a first plurality of warpage-reducing trenches 1321 in a first non-routing region 1310-2 of the interposer 1310. The first plurality of warpage-reducing trenches 1321 are characterized by a first trench width W1, first trench spacing S1, first trench depth D1, and first trench length (not shown in FIG. 13). A first warpage-relief material 1321-1 is deposited in the first plurality of warpage-reducing trenches 1321.

As shown in FIG. 13, the interposer includes a second plurality of warpage-reducing trenches 1322 in a second non-routing region 1310-3 of the interposer 1310. The second plurality of warpage-reducing trenches 1322 are characterized by a second trench width W2, second trench spacing S2, second trench depth D2, and second trench length (not shown in FIG. 13). A second warpage-relief material 1322-1 is deposited in the second plurality of warpage-reducing trenches 1322.

In accordance to some embodiments, the warpage-reducing trenches 1321 and 1322 are sized and positioned and deposited with a stress relief material according to the warpage characteristic of the chip package structure to reduce warpage. Depending on the embodiments, some of the trenches are formed in insulator layer 1312, and some of trenches can be formed in insulator layer 1312 and extend into substrate 1311, depending on trench depth required for warpage relief.

As described below, the trenches have elongated shapes with long sides perpendicular to a warpage direction in accordance with some embodiments. In some cases, the warpage-relief material comprises a tensile film to counter compressive stress in the interposer. In other cases, the warpage-relief material comprises a compressive film to counter tensile stress in the interposer.

In some embodiments, the first plurality of warpage-reducing trenches 1321 includes trenches having elongated shapes with long sides perpendicular to a first direction of a compressive stress in the interposer, and the first warpage-relief material is a tensile film deposited in the first plurality of warpage-reducing trenches.

In some embodiments, the second plurality of warpage-reducing trenches 1322 includes trenches having elongated shapes with long sides perpendicular to a second direction of a tensile stress in the interposer, and a second warpage-relief material is a compressive film deposited in the second plurality of warpage-reducing trenches In some embodiments, the tensile film includes a metal film, such as aluminum, copper, tungsten, titanium, or other suitable film, or combination thereof. The compressive film includes a silicon oxide film, a silicon nitride film, or a combination thereof.

In accordance with some embodiments, the warpage-reducing trenches may have different trench widths, trench spacings, trench depths, and trench lengths, depending on the warpage characteristics of the interposer, as described in more detail below. Further details of the trench forming process are also explained below.

FIG. 14 is another exemplary IC chip package structure having an interposer with trenches for reducing warpage, in accordance with some embodiments. As shown in FIG. 14, an integrated circuit (IC) chip package structure 1400, which is similar chip package structure 1300 in FIG. 13, but with additional components bonded to the back surface 1310b of interposer 1310. In the embodiments, an IC chip structure 1404 is bonded to the back surface 1310b of interposer 1310 through a second redistribution layer 1415. In this case, the second redistribution layer 1415 also includes a second insulating layer 1415-1 on the back surface 1411b, and interconnect structures 1433 formed in the second insulating layer 1415. The second redistribution layer 1415 can be bonded to the interposer 1310 using a bonding method, such as hybrid bonding. IC chip structure 1404, which can include one or more IC dies, is bonded to the second redistribution layer 1415 through bumps 1437.

Figure 15:
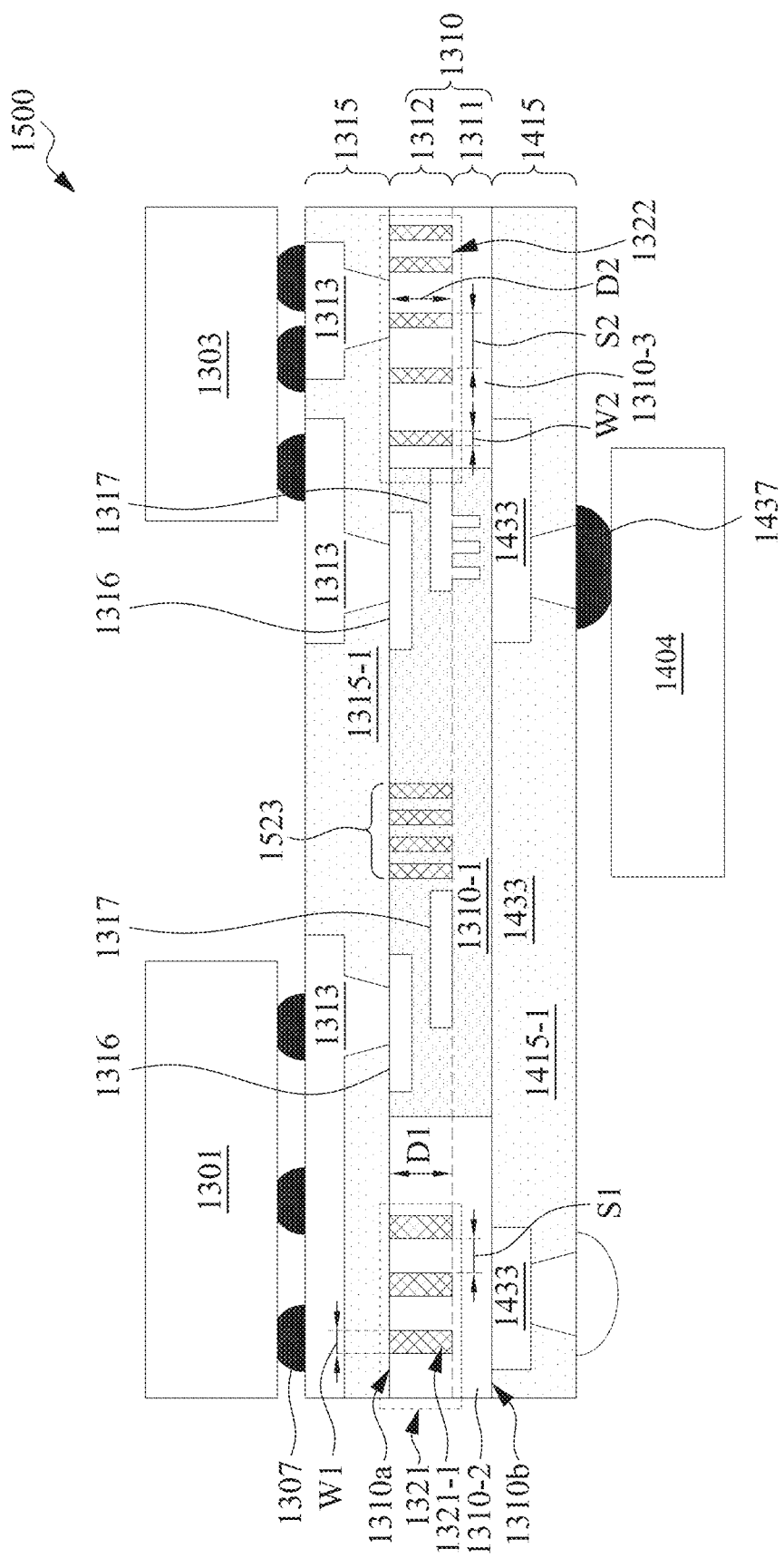
FIG. 15 is a cross-sectional view of another exemplary IC chip package structure having an interposer warpage-reducing with trenches, in accordance with some embodiments.

FIG. 15 is a cross-sectional view of another exemplary IC chip package structure having an interposer warpage-reducing with trenches, in accordance with some embodiments. As shown in FIG. 15, an integrated circuit (IC) chip package structure 1500, which is similar chip package structure 1400 in FIG. 14, but with IC chip structure 1302 and associated contact and interconnect structures 1313, 1314, 1316, 1317, 1433, and 1437 removed. This arrangement creates space for a third plurality of warpage-reducing trenches 1523. In accordance to some embodiments, similar to the warpage-reducing trenches 1321 and 1322, the third plurality of warpage-reducing trenches 1523 is sized and positioned and deposited with a stress relief material according to the warpage characteristic of the chip package structure to reduce warpage. Depending on the embodiments, some of the trenches are formed in insulator layer 1312, and some of trenches can be formed in insulator layer 1312 and extend into substrate 1311, depending on trench depth required for warpage relief. Other properties of warpage-reducing trenches 1323 are similar to those described above in connection to trenches 1321 and 1322.

In accordance with some embodiments, warpage-relief trench structures are formed in the substrate of an integrated circuit (IC) chip package structure. The trenches are sized and positioned based on a warpage characteristic to reduce the warpage of the chip package structure. For example, locations, sizes, and shapes of the trenches are designed to counteract the stress in the chip package structure. A warpage-relief material is deposited in the trenches according to the warpage characteristic to reduce the warpage of the chip package structure. The warpage characteristic can be measured, e.g., using Shadow Moire or other measuring methods. Alternatively, the warpage characteristic can be determined using theoretical analysis or computer simulation methods. In addition, machine learning using artificial intelligence methodology, such as neural network, liner regression, etc., can also be used to determine the warpage characteristic of the package. For example, a tensile material is used to counter compressive stress in the package, and a compressive material is used to counter tensile stress in the package. The large surface area along the sidewalls of the trenches can enhance the effectiveness of the warpage-relief material. Further, to counter warpage along the x-direction, trenches having elongated shapes are arranged with long sides perpendicular to the x-direction direction. To counter warpage along the y-direction, trenches having elongated shapes are arranged with long sides perpendicular to the y-direction direction. The techniques described herein can lead to reduction of stress, warpage, or breakage in IC chip package structures, and can improve the performance and yield of the product.

In accordance with some embodiments, a method for forming an integrated circuit (IC) chip package structure includes providing a first substrate for a first interposer for connecting a first group of selected IC dies, forming a conductive interconnect structure in and on the substrate for connecting the first group of the selected IC dies, and bonding the first group of the selected IC dies to the first interposer to form a first IC chip package structure. The method also includes determining a warpage characteristic of the first IC chip package structure. The method further includes providing a second substrate for a second interposer for connecting a second group of the selected IC dies. Moreover, the method includes forming trenches in the second substrate and depositing a layer of warpage relief material in the trenches based on the warpage characteristic of the first IC chip package structure, and forming the conductive interconnect structure in and on the second substrate for connecting the second group of the selected IC dies. In addition, the method also includes bonding the second group of the selected IC dies to the second interposer to form a second IC chip package structure.

In accordance with some embodiments, a method is provided for forming an integrated circuit (IC) chip package structure. The method includes providing a substrate for an interposer, and forming trenches in the substrate of the interposer. The trenches are sized and positioned based on a warpage characteristic to reduce the warpage of the chip package structure. The method also includes depositing a warpage-relief material in the trenches according to the warpage characteristic to reduce the warpage of the chip package structure. The method further includes forming a conductive interconnect structure in and on the substrate for connecting a group of selected IC dies, and bonding the group of the selected IC dies to the interposer to form a chip package structure. In some embodiments, the method also includes determining a warpage characteristic of a chip package structure including the group of selected IC dies bonded to an interposer without the trenches.

In accordance with some embodiments, an integrated circuit (IC) chip package structure includes an interposer having a substrate and a conductive interconnect structure disposed in and on the substrate. The IC chip package structure also includes trenches formed in the substrate, and the trenches are sized and positioned and deposited with a stress relief material according to a warpage characteristic of the chip package structure to reduce warpage. The IC chip package structure further includes IC dies bonded to the interposer.

In accordance with some embodiments, a method for forming an integrated circuit (IC) chip package structure includes providing an interposer including a substrate. The interposer includes routing regions and non-routing regions. The routing regions have conductive interconnect structures in and on the substrate for connecting to a group of IC dies, and the non-routing regions are without the conductive interconnect structures. The method includes forming a first plurality of warpage-reducing trenches in a first non-routing region of the interposer. The first plurality of warpage-reducing trenches characterized by a first trench width, first trench spacing, first trench length, and a first trench density based on warpage characteristics in the first non-routing region. A first warpage-relief material is deposited in the first plurality of warpage-reducing trenches. The method also includes forming a second plurality of warpage-reducing trenches in a second non-routing region of the interposer, the second plurality of warpage-reducing trenches characterized by a second trench width, a second trench spacing, a second trench length, and a second trench density, wherein the second trench width is different from the first trench width, the second trench spacing is different from the second trench spacing, and the second trench length is different from the first trench spacing, based on based on warpage characteristics in the second non-routing region. A second warpage-relief material is deposited in the second plurality of warpage-reducing trenches. The method further includes bonding the group of IC dies to the interposer to form an IC chip package.

In accordance with some embodiments, a method is provided for forming an integrated circuit (IC) chip package structure. The method includes providing a substrate for an interposer, and forming a conductive interconnect structure in and on the substrate for connecting a group of selected IC dies. The method includes forming warpage-reducing trenches in non-routing regions of the interposer, wherein the warpage-reducing trenches are sized and positioned based on a warpage characteristic to reduce the warpage of the chip package structure. The method also includes depositing a warpage-relief material in the warpage-reducing trenches according to the warpage characteristic to reduce the warpage of the chip package structure, and bonding the group of selected IC dies to the interposer to form a chip package structure.

In accordance with some embodiments, an integrated circuit (IC) chip package structure includes an interposer having a substrate and a conductive interconnect structure disposed in and on the substrate. The IC chip package structure also includes warpage-reducing trenches formed in non-routing regions of the interposer, wherein the warpage-reducing trenches are sized and positioned and deposited with a warpage relief material according to a warpage characteristic of the chip package structure to reduce warpage, and IC dies bonded to the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor package structure, the method comprising:
    providing an interposer having a front surface and a back surface, the interposer comprising:
        a substrate;
        at least one routing region having conductive interconnect structures in and on the substrate for connecting to a group of IC dies facing the front surface of the interposer; and
        at least one non-routing region without the conductive interconnect structures;
    forming at least one warpage-reducing trench in the at least one non-routing region, wherein the at least one warpage-reducing trench extends from the front surface of the interposer to a first depth, the first depth smaller than a thickness between the front surface and the back surface of the interposer;
    depositing a warpage-relief material in the at least one warpage-reducing trench; and
    bonding the group of IC dies to the front surface of the interposer.

2. The method of claim 1, wherein
    forming the at least one warpage-reducing trench comprises: forming at least one trench having an elongated shape with a long side perpendicular to a first direction of a compressive stress in the interposer; and
    depositing the warpage-relief material comprises: depositing a tensile film in the at least one trench.

3. The method of claim 2, wherein the tensile film comprises a metal film.

4. The method of claim 2, further comprising:
    determining the first direction of the compressive stress in the interposer.

5. The method of claim 4, wherein the first direction of the compressive stress in the interposer is determined using Shadow Moire images.

6. The method of claim 1, wherein
    forming the at least one warpage-reducing trench comprises: forming at least one trench having an elongated shape with a long side perpendicular to a second direction of a tensile stress in the interposer; and
    depositing the warpage-relief material comprises: depositing a compressive film in the at least one trench.

7. The method of claim 6, wherein the compressive film comprises silicon oxide.

8. The method of claim 6, wherein the compressive film comprises silicon nitride.

9. The method of claim 6, further comprising:
    determining the second direction of the tensile stress in the interposer.

10. The method of claim 9, wherein the second direction of the tensile stress in the interposer is determined using Shadow Moire images.

11. A method for forming an integrated circuit (IC) chip package structure, comprising:
    providing a substrate for an interposer having a front surface and a back surface;
    defining at least one routing region and at least one non-routing region laterally disposed with respect to each other in the substrate;
    forming a conductive interconnect structure in and on the substrate for connecting to a group of IC dies facing the front surface of the interposer;
    forming at least one warpage-reducing trench in the at least one non-routing region, wherein the at least one warpage-reducing trench extends from the front surface of the interposer to a first depth, the first depth smaller than a thickness between the front surface and the back surface of the interposer; and
    depositing a warpage-relief material in the at least one warpage-reducing trench.

12. The method of claim 11, further comprising:
    bonding the group of IC dies to the front surface of the interposer to form the IC chip package structure.

13. The method of claim 12, further comprising:
    determining warpage characteristics of a test IC chip package structure.

14. The method of claim 13, wherein the test IC chip package structure is the IC chip package structure without the at least one warpage-reducing trench and the warpage-relief material.

15. The method of claim 11, wherein depositing the warpage-relief material comprises:
    depositing a tensile film to counter compressive stress in the IC chip package structure.

16. The method of claim 11, wherein depositing the warpage-relief material comprises:
    depositing a compressive film to counter tensile stress in the IC chip package structure.

17. An integrated circuit (IC) chip package structure, comprising:
    a group of IC dies; and
    an interposer having a front surface and a back surface, the group of IC dies being bonded to the front surface, the interposer comprising:
        a substrate;
        at least one routing region having conductive interconnect structures in and on the substrate for connecting to a group of IC dies facing the front surface of the interposer; and at least one non-routing region without the conductive interconnect structures, wherein at least one warpage-reducing trench is disposed in the at least one non-routing region, wherein the at least one warpage-reducing trench extends from the front surface of the interposer to a first depth smaller than a thickness between the front surface and the back surface of the interposer, and wherein a warpage-relief material in the at least one warpage-reducing trench.

18. The IC chip package structure of claim 17, wherein the at least one warpage-reducing trench is characterized by an elongated shape with a long side perpendicular to a warpage direction.

19. The IC chip package structure of claim 17, wherein the warpage-relief material comprises a tensile film to counter compressive stress in the interposer.

20. The IC chip package structure of claim 17, wherein the warpage-relief material comprises a compressive film to counter tensile stress in the interposer.

* * * * *